United States Patent
Tanaka

(10) Patent No.: US 8,115,561 B2
(45) Date of Patent: Feb. 14, 2012

(54) LAMB-WAVE RESONATOR AND OSCILLATOR

(75) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 150 days.

(21) Appl. No.: 12/725,124

(22) Filed: Mar. 16, 2010

(65) Prior Publication Data

US 2010/0237959 A1    Sep. 23, 2010

(30) Foreign Application Priority Data

Mar. 19, 2009   (JP) ................... 2009-067544

(51) Int. Cl.
*H03H 9/00*     (2006.01)
*H03H 9/25*     (2006.01)

(52) U.S. Cl. ............... 331/107 A; 333/195; 310/313 D

(58) Field of Classification Search .............. 331/107 A; 333/195; 310/313 D
See application file for complete search history.

(56) References Cited

FOREIGN PATENT DOCUMENTS

| | | |
|---|---|---|
| JP | A-2003-258596 | 9/2003 |
| JP | A-2008-54163 | 3/2008 |

OTHER PUBLICATIONS

*Acoustic Wave Element Technical Handbook*, Chapter 1, 1991, pp. 148-158.
Nakagawa et al., "Temperature Characteristics of the Substrate for lamb Wave Type Elastic Wave Devices," *IEICE Transactions on Electronics*, J89C-No. 1, 2006, pp. 34-39.
*Ultrasonic Wave Handbook*, 1999, pp. 62-71.

*Primary Examiner* — Robert Pascal
*Assistant Examiner* — James E Goodley
(74) *Attorney, Agent, or Firm* — Oliff & Berridge PLC

(57) ABSTRACT

A Lamb-wave resonator includes: a piezoelectric substrate; an IDT electrode disposed on one principal surface of the piezoelectric substrate, having bus bar electrodes each connecting one ends of a plurality of electrode finger elements, the other ends of the plurality of electrode finger elements being interdigitated with each other to form an apposition area; and a pair of reflectors disposed on the one principal surface of the piezoelectric substrate, and respectively arranged on both sides of the IDT electrode in a propagation direction of a Lamb wave, wherein denoting a thickness of the piezoelectric substrate in the apposition area of the electrode finger elements as $t_i$, a thickness of the piezoelectric substrate in areas between respective ends of the apposition area in a direction perpendicular to the propagation direction of the Lamb wave and the bus bar electrodes as $t_g$, and a wavelength of the Lamb wave as $\lambda$, the thickness $t_i$ exists in a range represented by $0 < t_i/\lambda \leq 3$, and a relationship of $t_g < t_i$ is satisfied.

4 Claims, 20 Drawing Sheets

FIG. 2A
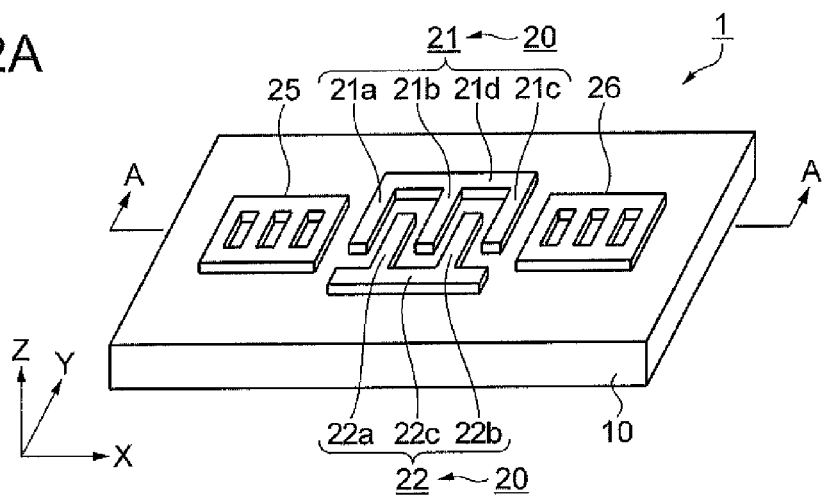
FIG. 2B
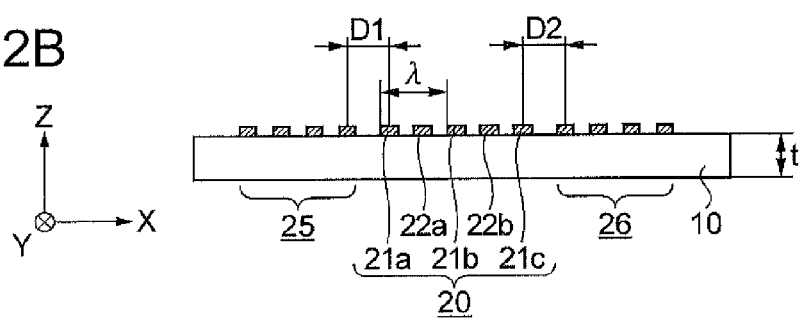
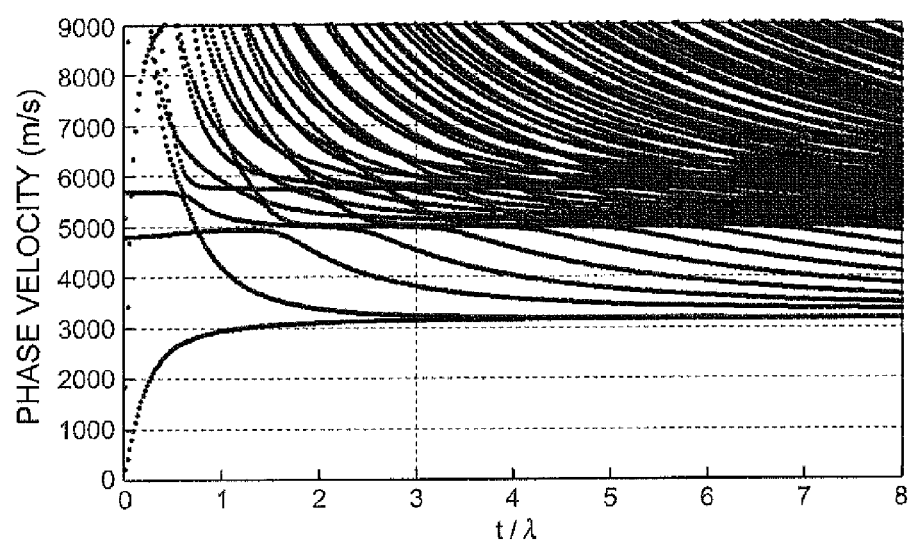
FIG. 3

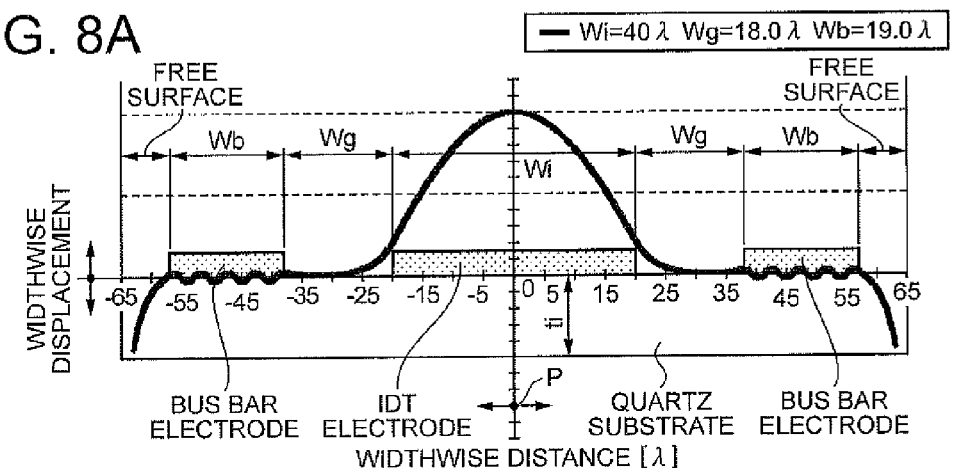
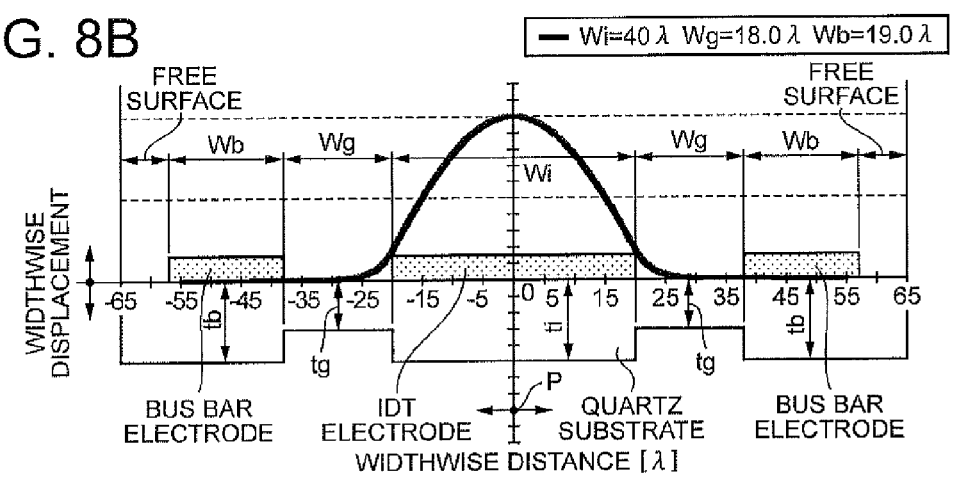
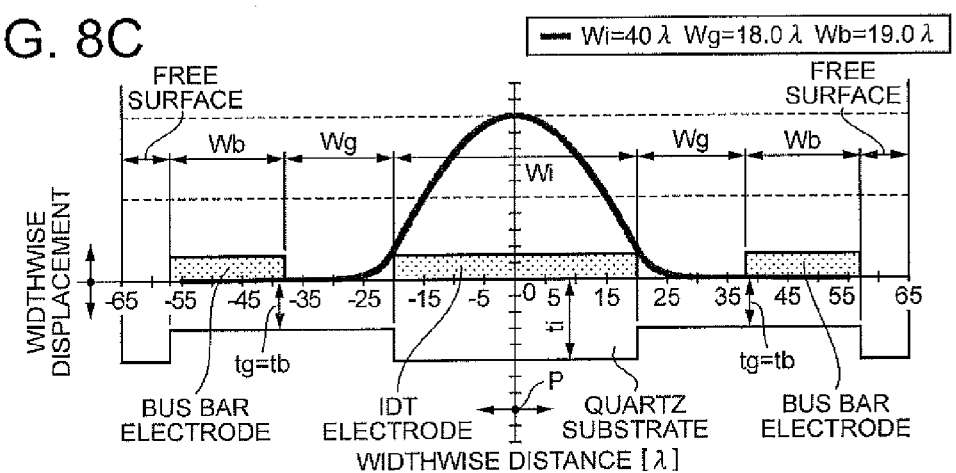

LAMB-WAVE RESONATOR AND OSCILLATOR

BACKGROUND

1. Technical Field

The present invention relates to a Lamb-wave resonator and an oscillator equipped with the Lamb wave resonator.

2. Related Art

A Lamb wave is a plate wave, which is a bulk wave propagates inside a substrate while being repeatedly reflected by upper and lower surfaces of the substrate in the case in which the substrate is arranged to have a thickness equal to or smaller than several wavelengths of the wave to be propagated. In contrast to a surface wave having 90% of the energy thereof in areas with a depth of within one wavelength from the surfaces of the substrate, such as a Rayleigh wave, a leaky surface acoustic wave, or a quasi longitudinal leaky surface acoustic wave, the Lamb wave is a bulk wave propagating inside the substrate, and therefore, the energy thereof is distributed throughout the entire substrate.

According to "Ultrasonic Wave Handbook" edited by Ultrasonic Wave Handbook Editorial Committee, published by Maruzen Co., Ltd. in 1999, pp. 62-71, plate waves and Rayleigh waves are also distinguished academically. Further, in "Acoustic Wave Element Technical Handbook" edited by the 150th committee of the Nippon Academy Promotion Association, published by Ohmsha, Ltd. in 1991, pp. 148-158, there is disclosed a method for analyzing Rayleigh waves and leaky surface acoustic waves, and in "Temperature characteristics of the substrate for lamb wave type elastic wave devices" by Yasuhiko Nakagawa, Mitsuyoshi Shigeda, Kazumasa Shibata, and Shouji Kakio, IEICE Transactions on Electronics J-89C No. 1, pp. 34-39, there is disclosed a method for analyzing Lamb waves. As a big difference therebetween, there can be cited a difference in method of selecting the solution of the eighth equation between the waves, and therefore, Rayleigh waves and Lamb waves are completely different waves having properties different from each other. Therefore, since Lamb waves cannot provide favorable characteristics under design conditions the same as those of Rayleigh waves, a design approach specified for Lamb waves is required.

As a feature of Lamb waves, as shown in the dispersion curve disclosed in JP-A-2003-258596, a mode of Lamb waves, which can be propagated, is a mode in which a wave number in a thickness direction of a substrate satisfies resonance conditions, and Lamb waves have a number of modes including high order ones.

Since the phase velocity of the existing modes of Lamb waves is equal to or higher than that of Rayleigh waves, and many of the modes have a phase velocity equal to or higher than that of longitudinal waves, the higher the phase velocity of the mode is, the more easily the higher frequency can be achieved even in the case in which the width of the electrode fingers is the same as that in the case of the surface wave described above. Further, by using an AT cut quartz substrate having a thickness of 5 wavelengths or less, it becomes possible to use Lamb waves having an excellent temperature characteristic and suitable for achieving a high frequency.

According to JP-A-2003-258596 described above, there is described that metal having a higher specific gravity is used as an electrode, thereby making it possible to increase a reflection coefficient of Lamb waves, and to trap the energy with less number of reflectors, and therefore, downsizing becomes possible. This means that energy trapping is achieved by suppressing a vibration leakage in a lengthwise direction (a propagation direction of Lamb waves). However, it is hard to say that this electrode design is always optimum because energy trapping in a widthwise direction (a direction perpendicular to the propagation direction of Lamb waves) is not considered. Further, JP-A-2008-54163 also fails to disclose specific measures to enhance energy trapping in the widthwise direction.

If the vibration leakage occurs in the widthwise direction (a direction perpendicular to the propagation direction of the Lamb wave), it is possible that it is difficult to take full advantage of the preferable characteristic of the Lamb waves, and degradation of the Q-value and increase in the CI-value, both the important factors in evaluating the resonance characteristic, are incurred. As a result, a sufficient characteristic is not obtained when applying it to an oscillator, and increase in power consumption and a serious problem of stoppage of oscillation are caused.

Further, if the vibration leakage in the widthwise direction reaches the widthwise outer end of the piezoelectric substrate, a spurious is caused by a reflected wave from the outer end of the piezoelectric substrate.

SUMMARY

The invention is for solving at least a part of the problem described above, and can be realized as the following embodiments or aspects.

According to a first aspect of the invention, there is provided a Lamb-wave resonator including a piezoelectric substrate, an IDT electrode disposed on one principal surface of the piezoelectric substrate, having bus bar electrodes each connecting one ends of a plurality of electrode finger elements, tips of the other ends of the plurality of electrode finger elements being interdigitated with each other, and a pair of reflectors disposed on the one principal surface of the piezoelectric substrate, and respectively arranged on both sides of the IDT electrode in a propagation direction of a Lamb wave, wherein denoting a thickness of the piezoelectric substrate in the apposition area of the electrode finger elements as ti, a thickness of the piezoelectric substrate in areas between respective ends of the apposition area in a direction perpendicular to the propagation direction of the Lamb wave and the bus bar electrodes as tg, and a wavelength of the Lamb wave as $\lambda$, the thickness ti exists in a range represented by $0 < ti/\lambda \leq 3$, and a relationship of $tg < ti$ is satisfied.

According to this aspect of the invention, although the details will be explained in the embodiment described later, the following advantage can be obtained. The phase velocity of a Lamb wave has a property of depending on the normalized substrate thickness ($t/\lambda$), and rises as the normalized substrate thickness becomes smaller.

Therefore, by making the thickness tg of the piezoelectric substrate in the areas between the respective ends of the apposition area in the direction perpendicular to the propagation direction of the Lamb wave and the bus bar electrodes smaller than the thickness ti of the piezoelectric substrate in the apposition area of the electrode finger elements, the phase velocity of the Lamb wave in the areas (also referred to as gaps in some cases) between the outer ends of the apposition area and the respective bus bar electrodes becomes higher than the phase velocity in the apposition area of the electrode finger elements. As a result, the displacement in the widthwise direction perpendicular to the propagation direction of the Lamb wave is converging. This shows the state in which the vibration leakage hardly exists in the free vibration surface (the area with only the piezoelectric substrate without electrodes) outside the bus bar electrodes, namely the state in which the energy is trapped.

As described above, by preventing the vibration leakage in the widthwise direction, it becomes possible to significantly reduce the amplitude of the reflected wave generated in the outer ends of the piezoelectric substrate in the widthwise direction, thereby reducing the spurious caused by the reflected waves from the outer ends of the piezoelectric substrate in the widthwise direction.

Thus, the drop of the Q-value as an important factor in evaluating the resonance characteristic of the Lamb-wave resonator and the increase in the CI value are prevented. Therefore, the oscillation of the Lamb-wave resonator can stably be maintained with the high Q-value, and the reduction of the power consumption can be realized with the low CI value.

According to a second aspect of the invention, in the Lamb-wave resonator of the above aspect of the invention, it is preferable that the piezoelectric substrate is a quartz substrate having Euler angles ($\phi$, $\theta$, $\psi$) in ranges of $-1° \leq \phi \leq 1°$, $35.0° \leq \theta \leq 47.2°$, and $-5° \leq \psi \leq +5°$, and a relationship between the thickness tg and the wavelength $\lambda$ of the Lamb wave satisfying $1.0\lambda \leq tg < 1.60\lambda$.

The frequency temperature characteristic, the frequency band, and the stability of the excitation of the Lamb-wave resonator are regulated by the cutout angle of the quartz substrate and the propagation direction of the Lamb wave. In other words, it is regulated by the Euler angles ($\phi$, $\theta$, $\psi$), and the normalized substrate thickness $t/\lambda$ expressed by the relationship between the substrate thickness t and the wavelength $\lambda$.

By arranging the angle $\phi$, the angle $\theta$, the angle $\psi$, and the normalized substrate thickness $t/\lambda$ to satisfy the relational expression described above, the frequency temperature characteristic superior to those of the STW-cut quartz device or the ST-cut quartz device, and support of a high-frequency band can be achieved.

Further, since the electromechanical coupling coefficient ($K^2$) representing the efficiency of the excitation of the quartz substrate can be enhanced, it becomes possible to provide a Lamb-wave resonator easily excited and having a stable frequency temperature characteristic.

According to a third aspect of the invention, in the Lamb-wave resonator of the above aspect of the invention, it is preferable that the apposition width of the electrode finger elements is equal to or larger than $20\lambda$.

When considering an application to an oscillator, the Lamb-wave resonator cannot be applied to the oscillator unless the oscillation conditions in the combination with the oscillation circuit are satisfied. However, according to the measurement result of the admittance circle diagram in the vicinity of a resonant frequency described later in the embodiment, since the admittance B becomes to satisfy B<0 to provide conductivity providing the apposition width is equal to or larger than $20\lambda$, stable oscillation can be achieved in the case of combining the Lamb-wave resonator and the oscillation circuit with each other.

According to a fourth aspect of the invention, there is provided an oscillator including the Lamb-wave resonator according to any one of the aspects of the invention described above, and an oscillation circuit adapted to excite the Lamb-wave resonator.

According to this aspect of the invention, by adopting the quartz substrate as the piezoelectric substrate, and adopting the Lamb-wave resonator having the optimum substrate thickness and the optimum apposition width described above to thereby prevent the vibration leakage in the widthwise direction, thus it becomes possible to provide an oscillator with a high Q-value and a low CI value, and superior in frequency temperature characteristic.

BRIEF DESCRIPTION OF THE DRAWINGS

The invention will now be described with reference to the accompanying drawings, wherein like numbers reference like elements.

FIGS. 2A and 2B are diagrams showing a basic form of a Lamb-wave resonator according to the embodiment, wherein FIG. 2A is a perspective view showing a schematic structure thereof, and FIG. 2B is a cross-sectional view showing a cutting surface along the line A-A in FIG. 2A.

FIG. 3 is a graph showing a relationship between a normalized substrate thickness $t/\lambda$ and a phase velocity.

FIGS. 4A and 4B are diagrams showing an example of the Lamb-wave resonator, wherein FIG. 4A is a plan view thereof viewed from the top thereof, and FIG. 4B is a cross-sectional view showing a cutting surface along the line B-B in FIG. 4A.

FIGS. 8A through 8C are explanatory diagrams showing a calculation result according to Example 4.

DESCRIPTION OF EXEMPLARY EMBODIMENT

An embodiment of the invention will hereinafter be explained with reference to the accompanying drawings.

It should be noted that the drawings referred to in the following explanations are schematic diagrams having contraction scales in the vertical and horizontal directions of the members or parts different from the actual scales for the sake of convenience of illustration.

EMBODIMENT

Figure 1:
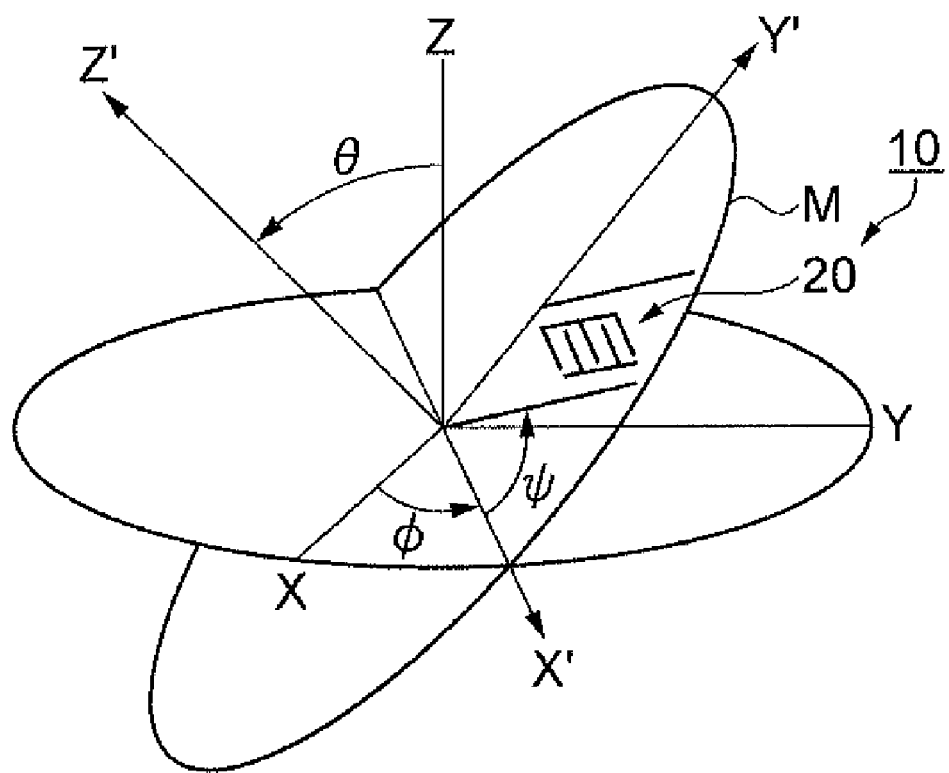
FIG. 1 is a diagram showing an azimuth direction in which a quartz substrate is cut out and a direction in which a Lamb wave propagates according to an embodiment.

FIG. 1 is an explanatory diagram showing an azimuth direction in which a quartz substrate is cut out and a direction in which a Lamb wave propagates according to the present embodiment, namely an explanatory diagram of the Euler angles (φ, θ, ψ). The azimuth direction in which the quartz substrate 10 as a piezoelectric substrate is cut out is defined by an X axis called an electrical axis, a Y axis called a mechanical axis, and a Z axis called an optical axis.

The quartz substrate 10 expressed by the Euler angles (0°, 0°, 0°) forms a Z-cut substrate having a main surface perpendicular to the Z axis. Here, the angle φ in the Euler angles relates to a first rotation of the Z-cut substrate, and represents a first rotation angle assuming that the Z axis is a rotation axis, and the rotation angle in a rotational direction from +X axis to +Y axis is a positive rotation angle.

The angle θ of the Euler angles relates to a second rotation performed subsequently to the first rotation of the Z-cut substrate, and represents a second rotation angle assuming that the X axis after the first rotation has been performed is the rotation axis, and the rotation angle in a rotational direction from +Y axis to +Z axis after the first rotation has been performed is a positive rotation angle. A cut surface of the quartz substrate 10 is determined based on the first rotation angle φ and the second rotation angle θ.

The angle ψ of the Euler angles relates to a third rotation performed subsequently to the second rotation of the Z-cut substrate, and represents a third rotation angle assuming that the Z axis after the second rotation has been performed is the rotation axis, and the rotation angle in a rotational direction from +X axis to +Y axis after the second rotation has been performed is a positive rotation angle. The propagation direction of the Lamb wave is represented by the third rotation angle ψ with respect to the X axis after the second rotation has been performed.

FIGS. 2A and 2B are diagrams showing a basic form of a Lamb-wave resonator according to the embodiment, wherein FIG. 2A is a perspective view showing a schematic structure thereof, and FIG. 2B is a cross-sectional view showing a cutting surface along the line A-A in FIG. 2A. The quartz substrate 10 according to the present embodiment is a rotated Y-cut quartz substrate having the cutout direction in which the Z axis in a thickness direction is rotated up to Z' by the angle θ, and is cut out so that the longitudinal direction corresponds to the X axis, the width direction corresponds to Y', and the thickness direction corresponds to Z' in the drawing (see FIG. 1).

In FIGS. 2A and 2B, a Lamb-wave resonator 1 includes the quartz substrate 10, an interdigital transducer (IDT) electrode 20 formed in an X-axis direction on one of main surfaces of the quartz substrate 10 so as to have a comb-tooth shape, a pair of reflectors 25 and 26 formed on both sides of the IDT electrode 20 in the propagation direction of the Lamb wave. Therefore, the propagation direction of the Lamb wave is set to be the X-axis direction.

Further, assuming that the thickness of the quartz substrate 10 is t, and the wavelength of the Lamb wave to be propagated is λ, a normalized substrate thickness t/λ is set to be in a range expressed by $0 < t/\lambda \leq 3$.

The IDT electrode 20 is formed of Al electrodes, and is composed of an input IDT electrode 21 and a ground (GND) IDT electrode 22. The ground (GND) IDT electrode 22 is not necessarily required to be grounded, but can be connected to a signal line. The input IDT electrode 21 has a plurality of electrode finger elements 21a, 21b, and 21c formed to have the same length and arranged to be parallel to each other, wherein one ends of the electrode finger elements 21a, 21b, and 21c are connected to each other via a bus bar electrode 21d. The GND IDT electrode 22 has a plurality of electrode finger elements 22a and 22b formed to have the same length and arranged to be parallel to each other, wherein one ends of the electrode finger elements 22a and 22b are connected to each other via a bus bar electrode 22c.

Tips of the electrode finger elements of the input IDT electrode 21 and the GND IDT electrode 22 are interdigitated to each other. The tips of the electrode finger elements 21a, 21b, and 21c are each disposed so as to have a space from the bus bar electrode 22c. Further, the tips of the electrode finger elements 22a and 22b are each disposed so as to have a space from the bus bar electrode 21d.

It should be noted that the width of the portions of the electrode finger elements 21a, 21b, and 21c of the input IDT electrode 21 and electrode finger elements 22a and 22b of the GND IDT electrode 22 opposed to each other when the electrode finger elements of the input IDT electrode 21 and the electrode finger elements of the GND IDT electrode 22 are interdigitated to each other is described as an apposition width.

It should be noted that in FIGS. 2A and 2B, the electrode finger elements of the IDT electrode 20 and the reflectors 25 and 26 are schematically illustrated with respect to the numbers thereof, and in practice, several tens through several hundreds of electrode finger elements are provided respectively.

The quartz substrate 10 is a thin substrate having surfaces in the directions of the X axis called the electrical axis, the Y axis called the mechanical axis, and the Z axis called the optical axis. However, the quartz substrate 10 according to the present embodiment is the rotated Y-cut quartz substrate having the cutout direction in which the Z axis in the thickness direction is rotated up to Z' by the angle θ, and in the drawing, the axis directions of the quartz substrate 10 shown in the drawing are indicated. Therefore, the thickness direction is represented as Z, the propagation direction of the Lamb wave is represented as X, and a direction perpendicular to the propagation direction of the Lamb wave is represented as Y. It should be noted that the X direction might be described as a lengthwise direction, and the Y direction might be described as a widthwise direction.

In the present embodiment, it is arranged that the pitch of the electrode finger elements 21a, 21b, and 21c and the pitch of the electrode finger elements 22a and 22b are λ (the wavelength of the Lamb wave), and the width of each of the electrode finger elements and the distance between the electrode finger elements adjacent to each other are (¼)λ.

In the Lamb-wave resonator 1, the quartz substrate 10 is excited by a drive signal input to the input IDT electrode 21 at a predetermined frequency, wherein the acoustic wave thus excited propagates towards the X direction of the quartz substrate 10 while being reflected by the top and bottom surfaces of the quartz substrate 10. The acoustic wave propagating as described above is called a Lamb wave.

Although the structure of the IDT electrode 20 is similar to that of an SAW resonator, the characteristic thereof is different therefrom because of the difference in the type of waves to be used therein, and therefore, the design conditions are naturally different therefrom. Then, the Lamb wave propagating from the IDT electrode 20 is reflected by the reflectors 25 and 26.

Accordingly, the distance D1 from the center of the electrode finger element 21a in the propagation direction of the Lamb wave to the center of the closest one of the electrode finger elements of the reflector 25 to the electrode finger element 21a in the propagation direction of the Lamb wave, and the distance D2 similarly from the center of the electrode finger element 21c in the propagation direction of the Lamb wave to the center of the closest one of the electrode finger elements of the reflector 26 to the electrode finger element 21c in the propagation direction of the Lamb wave are set to be (½)nλ ("n" is an integer) so that the reflected waves have the phases identical to that of the drive signal at a predetermined frequency.

It should be noted that it is possible to set the distance D1 between the electrode finger element 21a and the reflector 25 and the distance D2 between the electrode finger element 21c and the reflector 26 to be different from (½)λ.

Subsequently, the relationship between the normalized substrate thickness t/λ and the phase velocity will be explained with reference to the accompanying drawings.

FIG. 3 is a graph showing the relationship between the normalized substrate thickness t/λ and the phase velocity. The horizontal axis represents the normalized substrate thickness t/λ, and the vertical axis represents the phase velocity (m/s). Further, the Lamb-wave resonator employing the quartz substrate 10 as a piezoelectric substrate is shown as an example.

According to FIG. 3, there is shown the fact that the Lamb-wave resonator 1 has a plurality of modes, and that the phase velocities in the respective modes aggregate in a range from 3000 (m/s) to 6000 (m/s), and in particular, densely aggregate in a range from 5000 (m/s) to 6000 (m/s), as the normalized substrate thickness t/λ increases.

It is conceivable that in the case in which the modes densely aggregate described as above, the mode coupling is apt to be caused, making it difficult to obtain a desired mode, or the phase velocity is apt to vary. Therefore, by setting the normalized substrate thickness to satisfy t/λ≦3, it becomes possible to eliminate the range in which the mode coupling is apt to occur.

Further, according to FIG. 3, there is shown a tendency that the smaller the normalized substrate thickness t/λ is, the higher the phase velocity becomes, and in the range of the normalized substrate thickness t/λ satisfying t/λ≦3, there exist a number of modes having the phase velocity of equal to or higher than 6000 (m/s). Since the phase velocity is represented by a product of a frequency and a wavelength, this shows that the Lamb-wave resonator is available for a high frequency application.

Then, the configuration of the IDT electrode 20 will hereinafter be described.

Figures 4A, 4B:
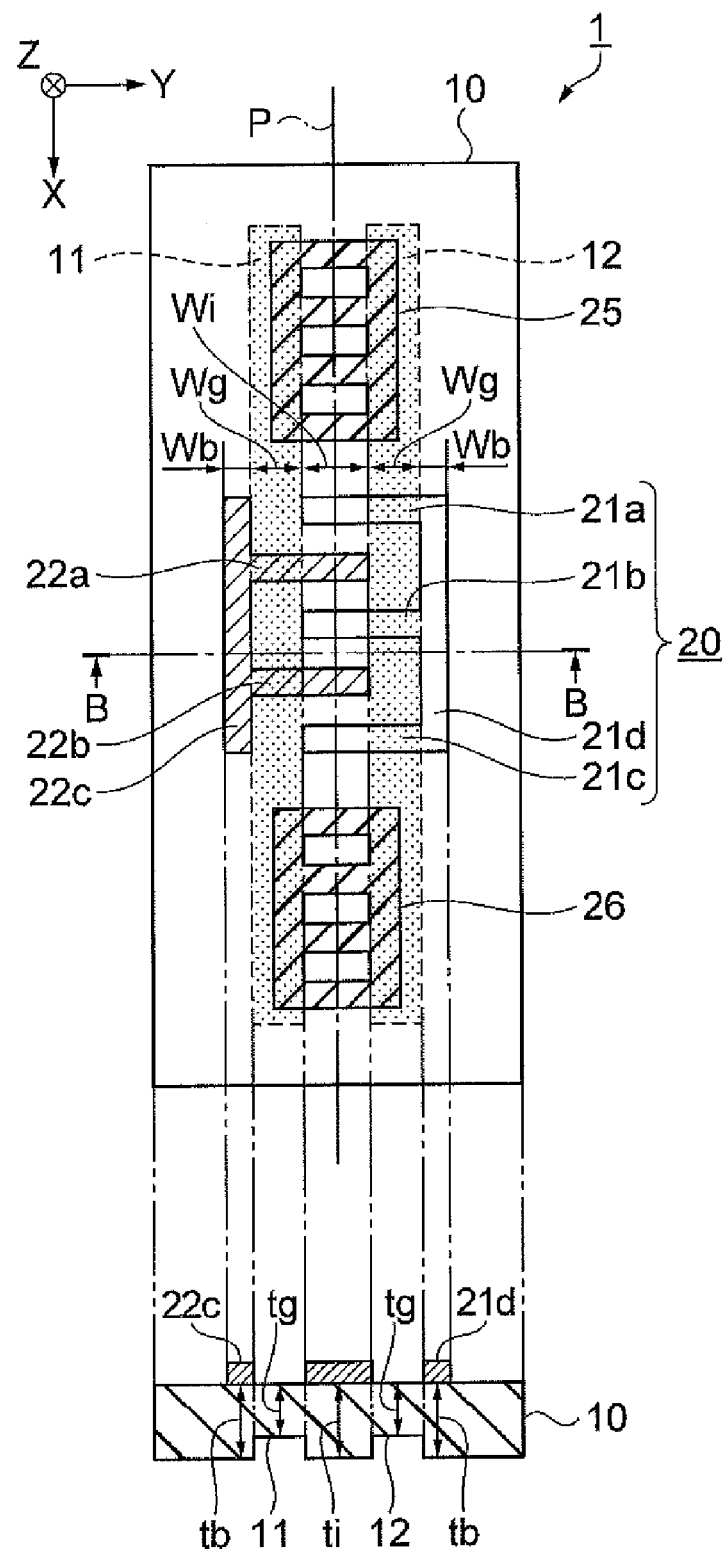

FIGS. 4A and 4B are diagrams showing an example of the Lamb-wave resonator, wherein FIG. 4A is a plan view thereof viewed from a principal surface thereof, and FIG. 4B is a cross-sectional view showing a cutting surface along the line B-B in FIG. 4A. Firstly, optimum electrode design parameters proposed in the present embodiment will be explained. In FIG. 4A, the apposition width (the apposition area) of the electrode finger elements with which the electrode finger elements 21a, 21b, and 21c and electrode finger elements 22a and 22b are opposed to each other when the electrode finger elements are interdigitated to each other is denoted as Wi.

Further, there are denoted the width of the bus bar electrodes 21d, 22c as Wb, the distance between the tip of each of the electrode finger elements 21a, 21b, and 21c and the bus bar electrode 22c and the distance between the tip of each of the electrode finger elements 22a and 22b and the bus bar electrode 21d as Wg (hereinafter also described as a gap Wg). In other words, the gap Wg is the distance between respective ends of the apposition area of the IDT electrode 20 in a direction perpendicular to the propagation direction of the Lamb wave and the bus bar electrodes 21d, 22c.

It should be noted that the center position of the quartz substrate 10 in the Y direction (widthwise direction) is represented as a center line P. The IDT electrode 20 and the reflectors 25 and 26 are formed on the center line P. Further, the electrode finger elements of the respective reflectors 25, 26 are disposed within the range of the apposition width Wi.

Then, an example of the cross-sectional shape of the Lamb-wave resonator 1 will be described with reference to FIG. 4B. The quartz substrate 10 is provided with thin wall portions 11, 12 on the reverse surface opposed to the principal surface on which the IDT electrode 20 and the reflectors 25, 26 are formed.

Here, the thickness of the quartz substrate 10 in the apposition area (the range represented by the apposition width Wi) of the IDT electrode 20 is denoted as ti, the thickness of the quartz substrate 10 in the ranges of the gaps Wg between the respective outer ends of the apposition area in the Y direction and the bus bar electrodes 21d, 22c is denoted as tg, and the thickness of the quartz substrate 10 in the ranges on and outer the respective bus bar electrodes 21d, 22c is denoted as tb.

The thicknesses ti, tg, and tb of the respective regions of the quartz substrate 10 are arranged to exist in the range expressed by 0<ti/λ≦3 and 0<tg/λ≦3, and to satisfy the relationship of tg<ti when the wavelength of the Lamb wave is λ. It should be noted that FIGS. 4A and 4B show the case of ti=tb as an example.

It should be noted that the formation ranges of the respective thin wall portions 11, 12 in the X direction are preferably arranged to be within the outer ends of the reflectors 25, 26 including the IDT electrode 20 as shown in FIG. 4A.

Regarding the Lamb-wave resonators, although there are some documents related to basic properties thereof, no document related to the energy trapping in the widthwise direction (the Y direction) can be found, and therefore, the optimum design conditions remain unclear. Therefore, the inventors have proceeded with a detailed investigation related to the energy trapping of the Lamb wave in the widthwise direction.

As a result, it has turned up that Lamb waves are apt to cause the vibration leakage in the widthwise direction compared to quartz SAW, and are sensitive to the design conditions of the apposition width Wi and the gap Wg of the electrode finger elements, and therefore, it is effective for trapping the energy in the widthwise direction to set the phase velocity in the range of the apposition width Wi to be lower than the phase velocity in the range of the gap Wg.

Then, a differential equation controlling a displacement of the Lamb wave in the widthwise (Y) direction will be described. This differential equation can be obtained based on Lagrangian L=T−U (T represents kinetic energy, and U represents potential energy), which can be obtained by integrating the vibration energy of the Lamb-wave resonator in length and depth directions, and can be expressed as the following formula.

Formula 1

$$a\omega_0^2 \frac{\partial^2 U(Y)}{\partial Y^2} + (\omega^2 - \omega_0^2)U(Y) = 0 \quad (1)$$

Here, U(Y) represents a widthwise displacement, Y represents a y coordinate (y/λ) normalized by the wavelength λ of the Lamb wave, a constant "a" represents a shear effect coefficient in the widthwise direction, ω to represents an angular frequency, $\omega_o$ represents an angular frequency of the Lamb-wave resonator with the electrode finger elements having the infinite apposition width. The constant "a" is obtained based on an analysis result, or a measurement result, and is 0.021 in the embodiment. Based on the differential equation, the displacement of the Lamb-wave resonator in the widthwise direction is calculated.

Subsequently, the calculation results of the specific working examples will be explained with reference to FIGS. 5A through 15B. It should be noted that FIGS. 5A through 15B each show the cutting surface of the quartz substrate 10 along the line B-B shown in FIG. 4A. Further, the horizontal axis represents the distance in the widthwise direction (the Y direction) assuming that the center line P of the quartz substrate corresponds to 0, and the vertical axis represents the displacement in the widthwise direction. It should be noted that the values Wi, Wg, Wb, ti, tg, and tb are normalized by the wavelength λ.

Example 1

Figure 5A:
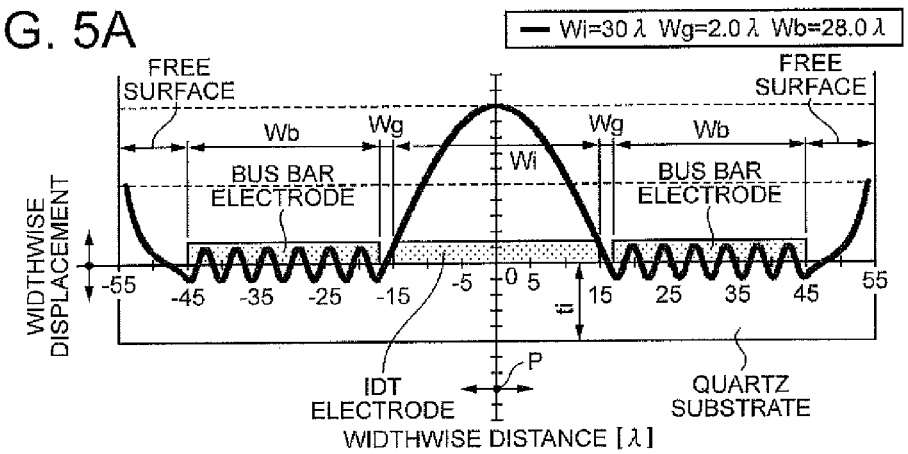
FIGS. 5A through 5C are explanatory diagrams showing a calculation result according to Example 1.
Figure 5B:
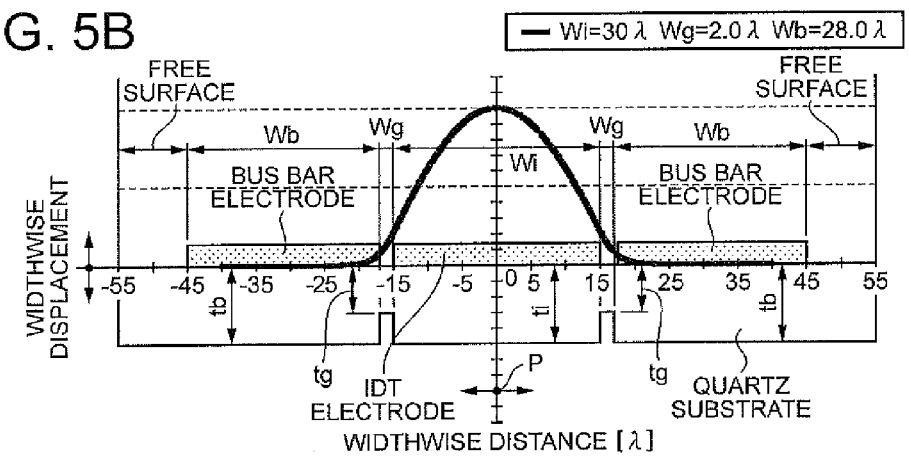
Figure 5C:
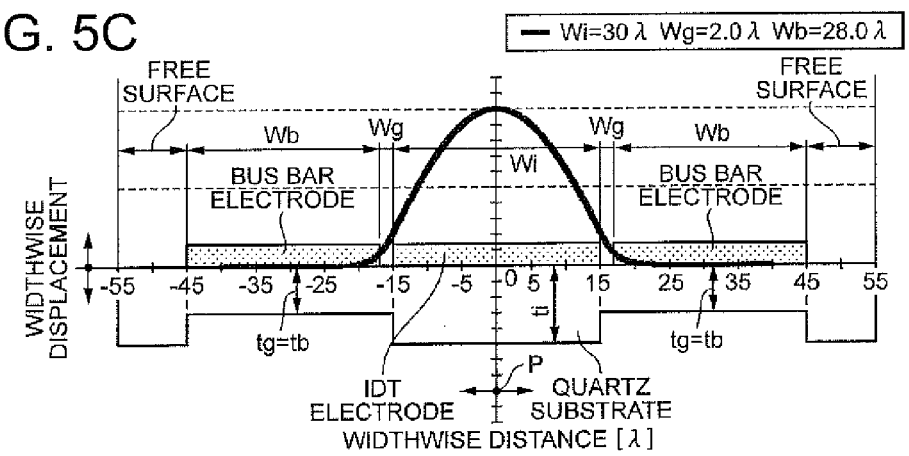

FIGS. 5A through 5C are explanatory diagrams showing a calculation result according to Example 1. In the Example 1, there is shown the case of arranging the Euler angles (0°, 42.0°, 0°), Wi=30λ, Wg=2.0λ, and Wb=28.0λ as an example, and FIG. 5A shows the widthwise displacement distribution of the quartz substrate in the resonant state in the case of arranging the quartz substrate to have an even thickness.

As shown in FIG. 5A, the displacement becomes the maximum at the center (on the center line P) of the IDT electrode. However, in the areas outside the apposition width Wi and reaching the free surface, the widthwise displacement does not converge, but the displacement in the outer ends of the quartz substrate in the widthwise direction becomes larger. In other words, it shows that the energy is not trapped because of the occurrence of the vibration leakage.

The occurrence of the vibration leakage to the free surface causes loss of energy, drop of the Q-value as an important factor in evaluating the resonance characteristic of the resonator, and increase in a crystal impedance (CI) value. The drop of the Q-value makes it difficult to stably maintain the oscillation of the Lamb-wave resonator, and the increase in the CI value leads to increase in the power consumption.

As described above, if the vibration leakage occurs from the outer ends of the bus bar electrodes toward the outer ends of the quartz substrate in the widthwise direction, the spurious is caused by the reflected wave propagating from the outer end of the quartz substrate.

FIG. 5B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.3λ.

According to this arrangement, the displacement becomes the maximum at the center (on the center line P) of the IDT electrode as shown in FIG. 5B. However, in the areas outside the apposition width Wi and reaching the free surface, the widthwise displacement converges, but the displacement in the outer ends of the quartz substrate in the widthwise direction does not occur. In other words, it shows that the energy is trapped because the vibration leakage is prevented.

The reason that the energy trapping state is thus varied between FIGS. 5A and 5B will be explained. According to the relationship between the normalized substrate thickness t/λ and the phase velocity shown in FIG. 3, the phase velocity increases by reducing the thickness of the quartz substrate. Therefore, by arranging the thicknesses to satisfy tg<ti, the phase velocity of the Lamb wave in the gap area (Wg) becomes higher than the phase velocity thereof in the area of the apposition width Wi of the IDT electrode to thereby satisfy the energy trapping condition in the widthwise direction.

Then, the case in which the area with a thickness smaller than the thickness ti is changed will be explained.

FIG. 5C shows the case in which the thickness tg in the gap area (Wg) of the quartz substrate and the thickness tb in the bus bar electrode area thereof are arranged to be equal to each other. It should be noted that the thicknesses in the respective areas are arranged as ti=1.6λ, and tg=tb=1.0λ.

In FIG. 5C, similarly to the case of FIG. 5B, the displacement becomes the maximum at the center (on the center line P) of the IDT electrode, the widthwise displacement converges in the area outside the apposition width Wi and reaching the free surface, and no displacement occurs in the outer ends of the quartz substrate in the widthwise direction. In other words, it shows that the energy is trapped because the vibration leakage is prevented.

Hereinafter, the energy trapping in the cases of changing the dimensions of Wi, Wg, Wb, ti, tg, and tb will be explained.

Example 2

Figure 6A:
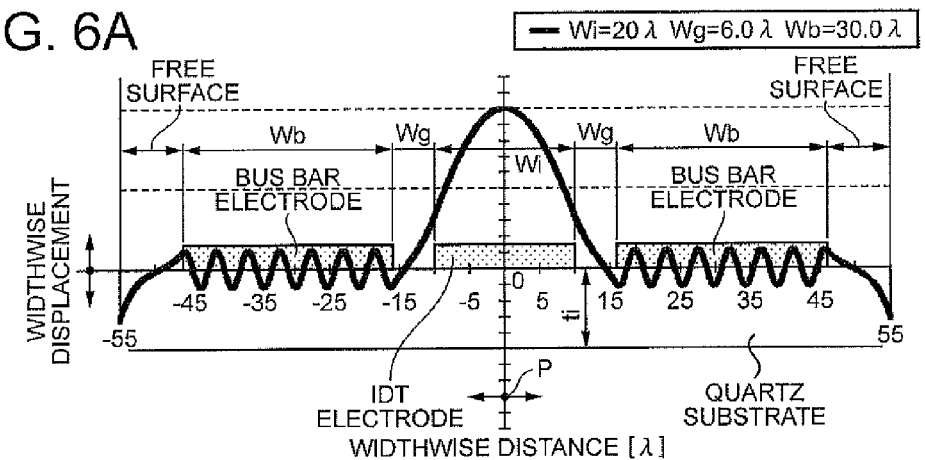
FIGS. 6A through 6C are explanatory diagrams showing a calculation result according to Example 2.
Figure 6B:
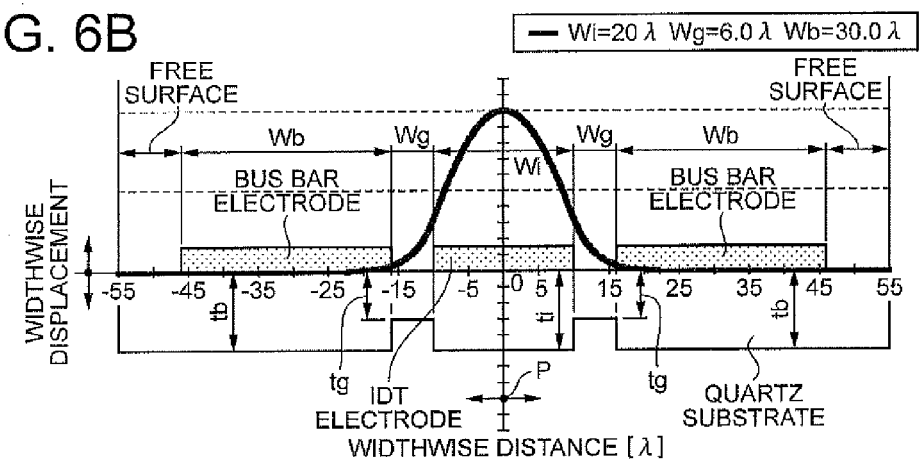
Figure 6C:
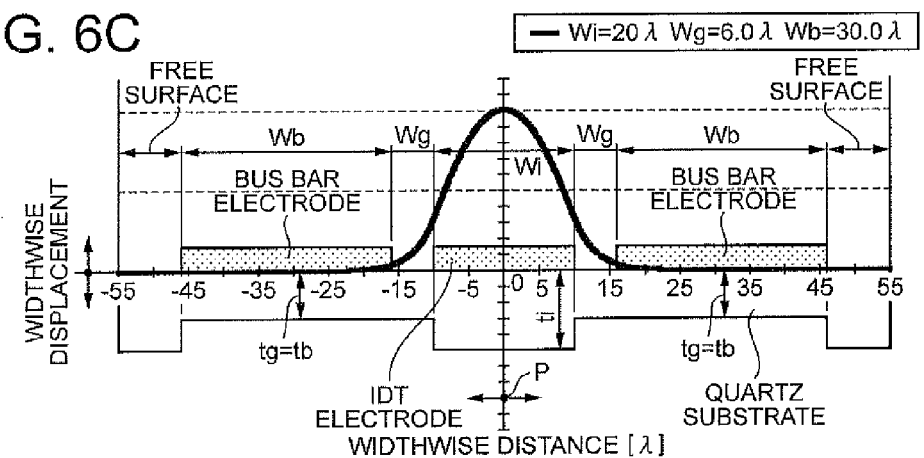

FIGS. 6A through 6C are explanatory diagrams showing a calculation result according to Example 2. In the Example 2, there is shown the case of arranging the Euler angles (0°, 42.0°, 0°), Wi=20λ, Wg=6.0λ, and Wb=30.0λ as an example, and FIG. 6A shows the widthwise displacement distribution of the quartz substrate in the resonant state in the case of arranging the quartz substrate to have an even thickness.

As shown in FIG. 6A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 6B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.0λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

FIG. 6C shows the case in which the thickness tg in the gap area (Wg) of the quartz substrate and the thickness tb in the bus bar electrode area thereof are arranged to be equal to each other. It should be noted that the thicknesses in the respective areas are arranged as ti=1.6λ, and tg=tb=1.0λ.

In FIG. 6C, similarly to the case of FIG. 6B, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 3

Figure 7A:
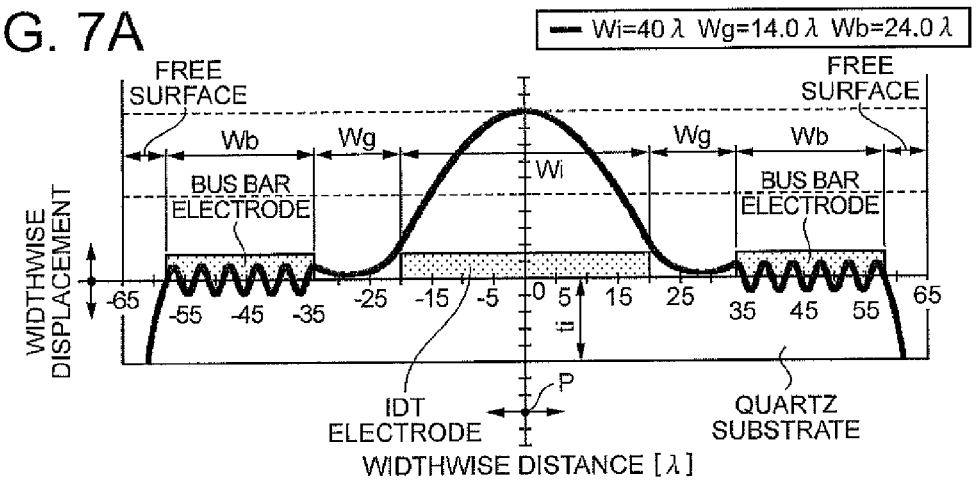
FIGS. 7A through 7C are explanatory diagrams showing a calculation result according to Example 3.
Figure 7B:
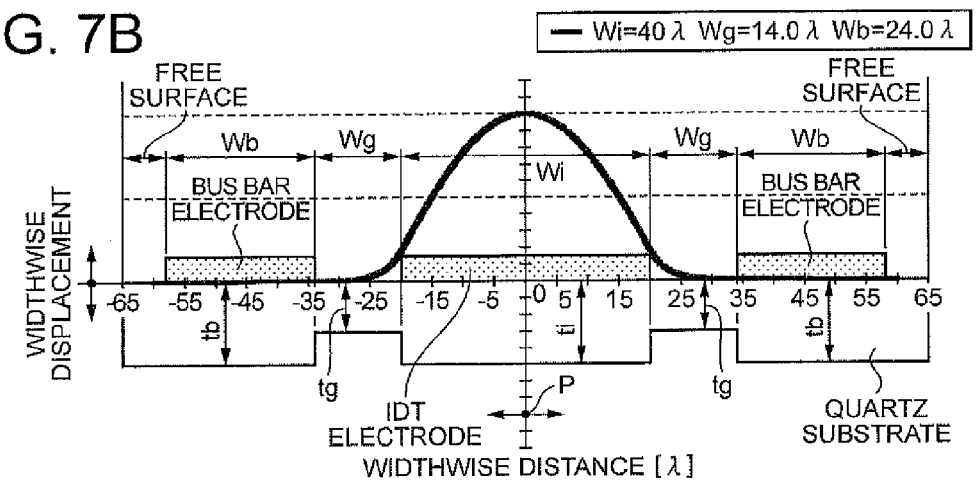
Figure 7C:
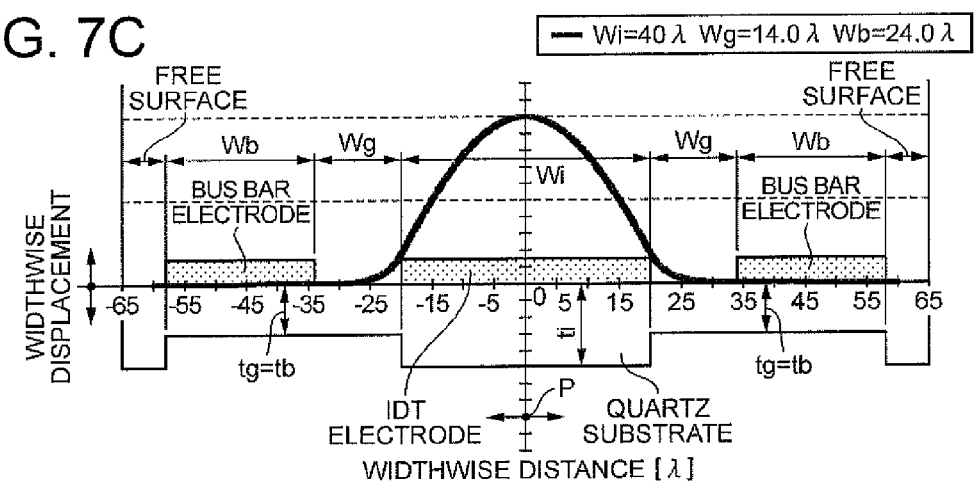

FIGS. 7A through 7C are explanatory diagrams showing a calculation result according to Example 3. In the Example 3, there is shown the case of arranging the Euler angles (0°, 42.0°, 0°), Wi=40λ, Wg=14.0λ, and Wb=24.0λ as an example, and FIG. 7A shows the widthwise displacement distribution of the quartz substrate in the resonant state in the case of arranging the quartz substrate to have an even thickness.

As shown in FIG. 7A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 7B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.1λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

FIG. 7C shows the case in which the thickness tg in the gap area (Wg) of the quartz substrate and the thickness tb in the bus bar electrode area thereof are arranged to be equal to each other. It should be noted that the thicknesses in the respective areas are arranged as ti=1.6λ, and tg=tb=1.1λ.

In FIG. 7C, similarly to the case of FIG. 7B, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 4

FIGS. 8A through 8C are explanatory diagrams showing a calculation result according to Example 4. In the Example 4, there is shown the case of arranging the Euler angles (0°, 42.0°, 0°), Wi=40λ, Wg=18.0λ, and Wb=19.0λ as an example, and FIG. 8A shows the widthwise displacement distribution of the quartz substrate in the resonant state in the case of arranging the quartz substrate to have an even thickness.

As shown in FIG. 8A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 8B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.2λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

FIG. 8C shows the case in which the thickness tg in the gap area (Wg) of the quartz substrate and the thickness tb in the bus bar electrode area thereof are arranged to be equal to each other. It should be noted that the thicknesses in the respective areas are arranged as ti=1.6λ, and tg=tb=1.2λ.

In FIG. 8C, similarly to the case of FIG. 8B, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 5

Figure 9A:
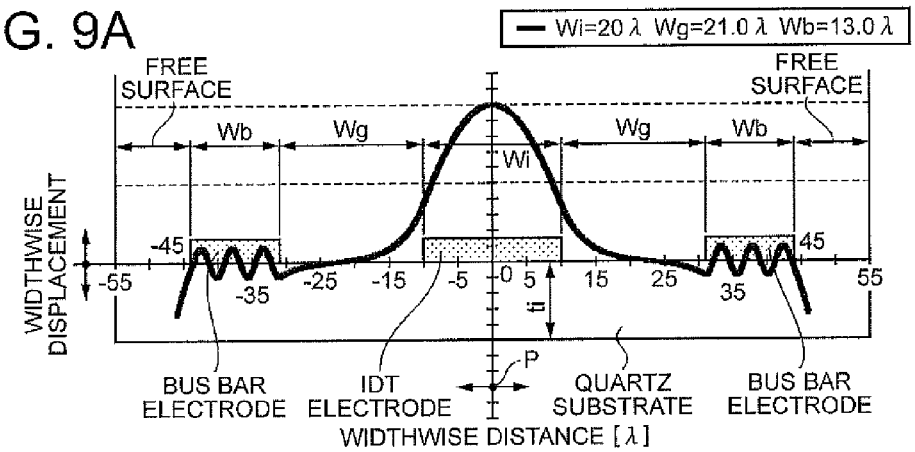
FIGS. 9A through 9C are explanatory diagrams showing a calculation result according to Example 5.
Figure 9B:
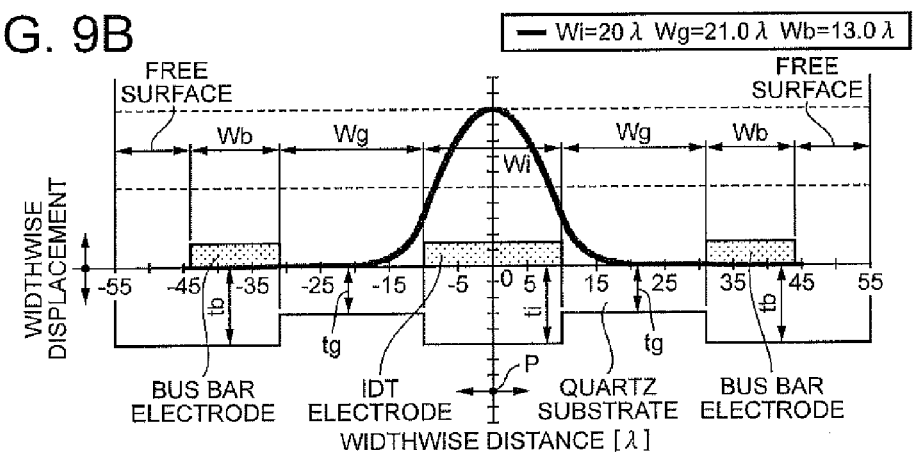
Figure 9C:
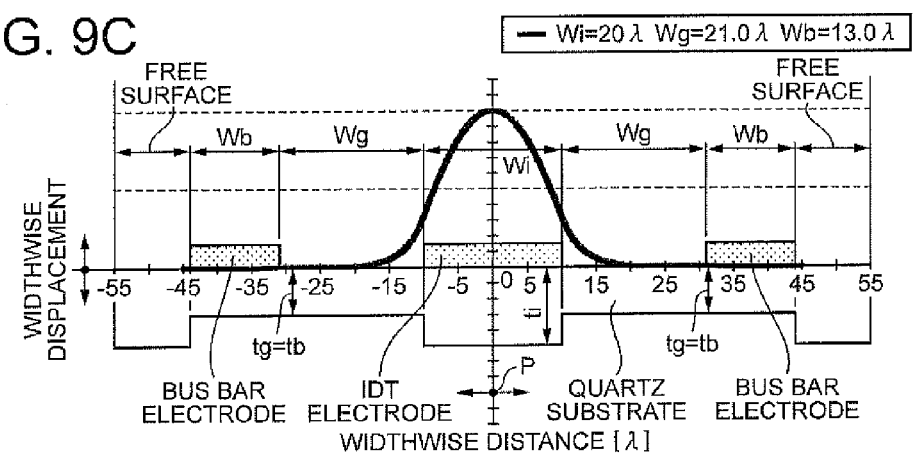

FIGS. 9A through 9C are explanatory diagrams showing a calculation result according to Example 5. In the Example 5, there is shown the case of arranging the Euler angles (0°, 42.0°, 0°), Wi=20λ, Wg=21.0λ, and Wb=13.0λ as an example, and FIG. 9A shows the widthwise displacement distribution of the quartz substrate in the resonant state in the case of arranging the quartz substrate to have an even thickness.

As shown in FIG. 9A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 9B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.58λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

FIG. 9C shows the case in which the thickness tg in the gap area (Wg) of the quartz substrate and the thickness tb in the bus bar electrode area thereof are arranged to be equal to each other. It should be noted that the thicknesses in the respective areas are arranged as ti=1.6λ, and tg=tb=1.58λ.

In FIG. 9C, similarly to the case of FIG. 9B, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Subsequently, the energy trapping state in the case of changing the Euler angles (φ, θ, ψ) of the quartz substrate will be explained.

Example 6

Figure 10A:
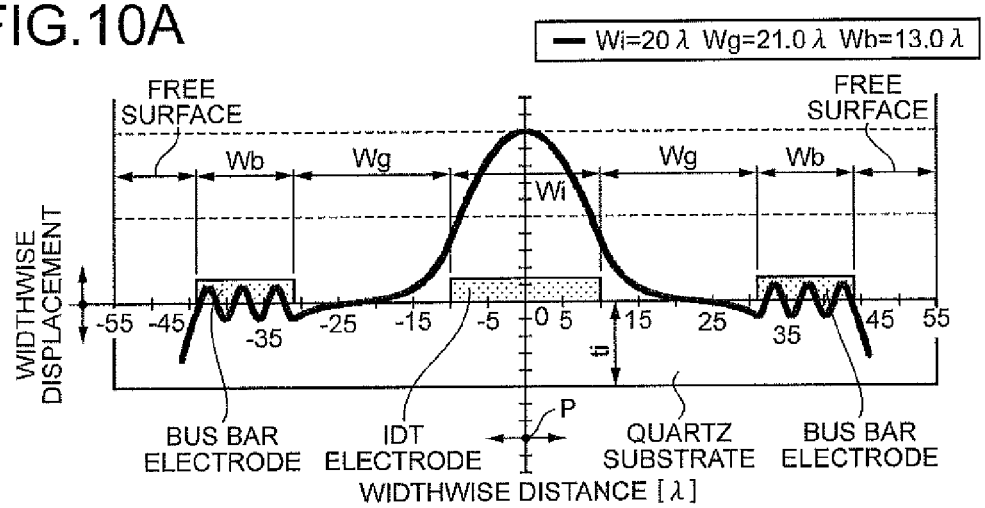
FIGS. 10A and 10B are explanatory diagrams showing a calculation result according to Example 6.
Figure 10B:
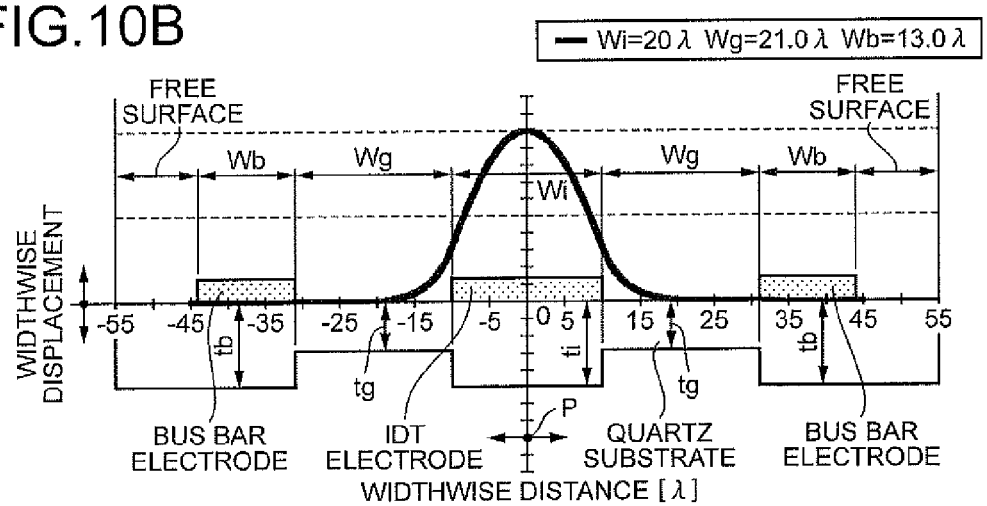

FIGS. 10A and 10B are explanatory diagrams showing a calculation result according to Example 6. In the Example 6, there is shown the case of arranging the Euler angles (+1.0°, 42.0°, 0°), Wi=20λ, Wg=21.0λ, and Wb=13.0λ as an example, and FIG. 10A shows the widthwise displacement distribution of the quartz substrate in the resonant state in the case of arranging the quartz substrate to have an even thickness of ti=1.6λ.

As shown in FIG. 10A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 10B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.2λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 7

Figure 11A:
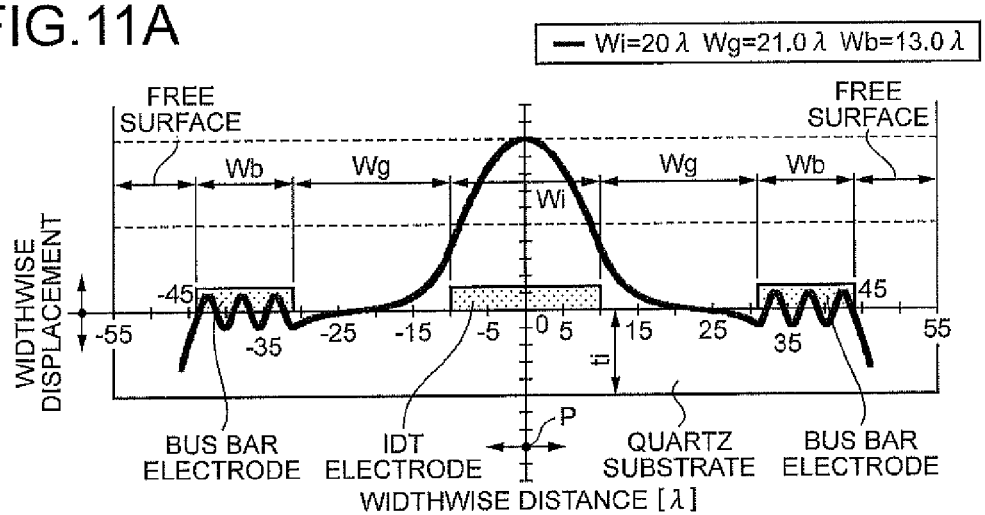
FIGS. 11A and 11B are explanatory diagrams showing a calculation result according to Example 7.
Figure 11B:
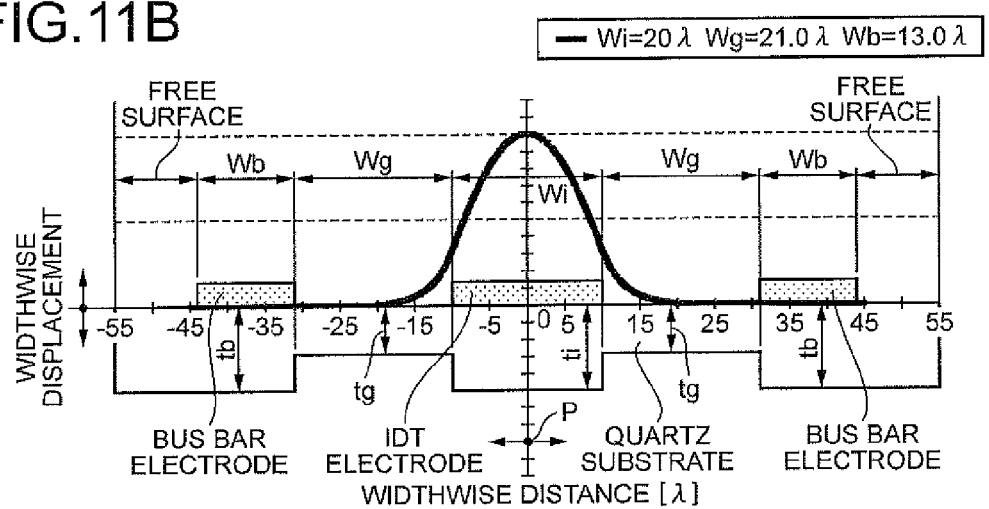

FIGS. 11A and 11B are explanatory diagrams showing a calculation result according to Example 7. In the Example 7, there is shown the case of arranging the Euler angles (−1.0°, 42.0°, 0°), Wi=20λ, Wg=21.0λ, and Wb=13.0λ as an example, and FIG. 11A shows the widthwise displacement distribution of the quartz substrate in the resonant state in the case of arranging the quartz substrate to have an even thickness of ti=1.6λ.

As shown in FIG. 11A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 11B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.2λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 8

Figure 12A:
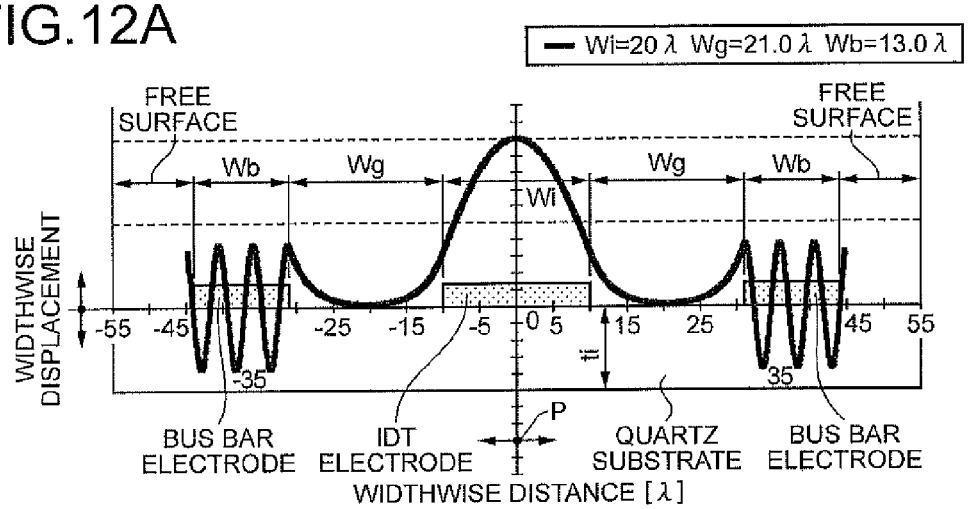
FIGS. 12A and 12B are explanatory diagrams showing a calculation result according to Example 8.
Figure 12B:
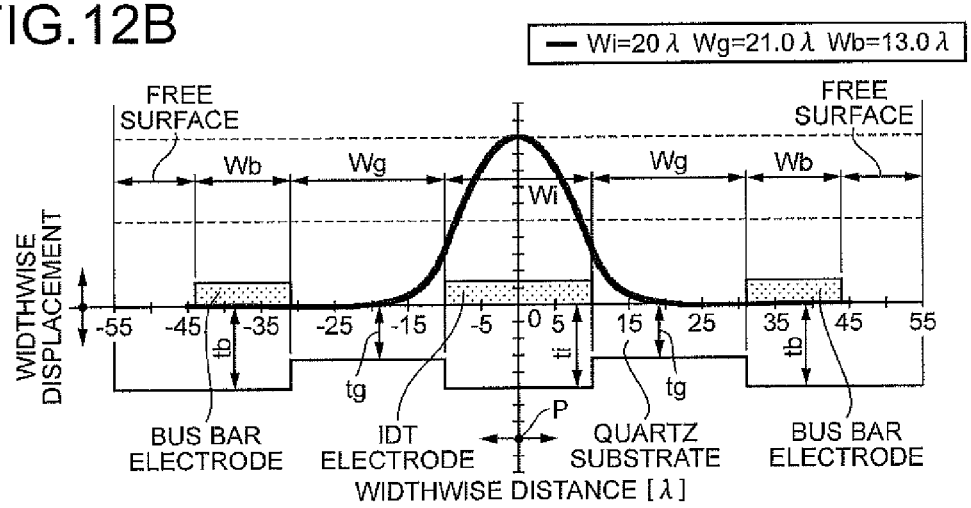

FIGS. 12A and 12B are explanatory diagrams showing a calculation result according to Example 8. In the Example 8, there is shown the case of arranging the Euler angles (0°, 33.5°, 0°), Wi=20λ, Wg=21.0λ, and Wb=13.0λ as an example, and FIG. 12A shows the widthwise displacement distribution of the quartz substrate in the resonant state in the case of arranging the quartz substrate to have an even thickness of ti=1.6λ.

As shown in FIG. 12A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 12B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.43λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 9

Figure 13A:
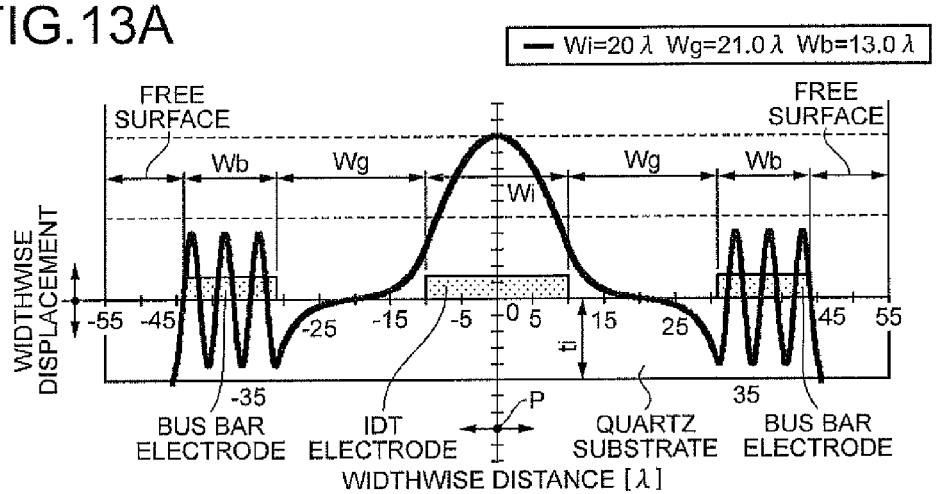
FIGS. 13A and 13B are explanatory diagrams showing a calculation result according to Example 9.
Figure 13B:
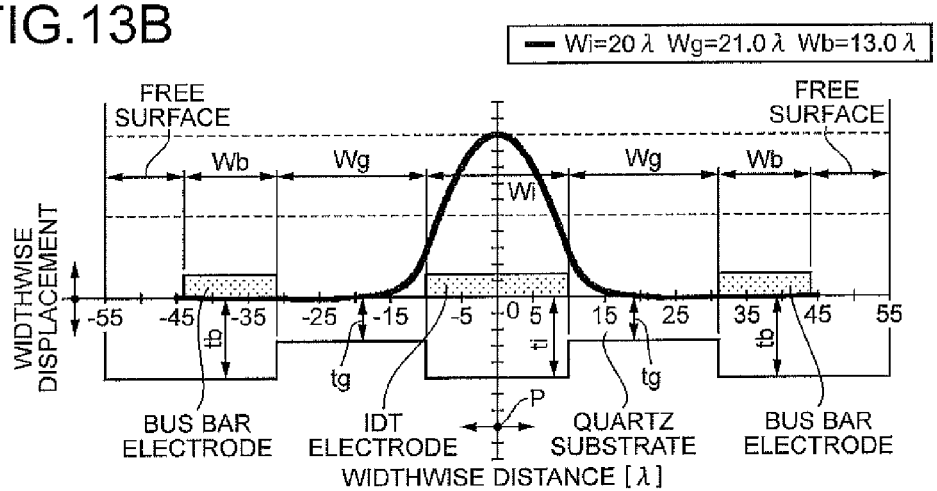

FIGS. 13A and 13B are explanatory diagrams showing a calculation result according to Example 9. In the Example 9, there is shown the case of arranging the Euler angles (0°, 48.2°, 0°), Wi=20λ, Wg=21.0λ, and Wb=13.0λ as an example, and FIG. 13A shows the widthwise displacement distribution of the quartz substrate in the resonant state in the case of arranging the quartz substrate to have an even thickness of ti=1.6λ.

As shown in FIG. 13A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 13B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.15λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 10

Figure 14A:
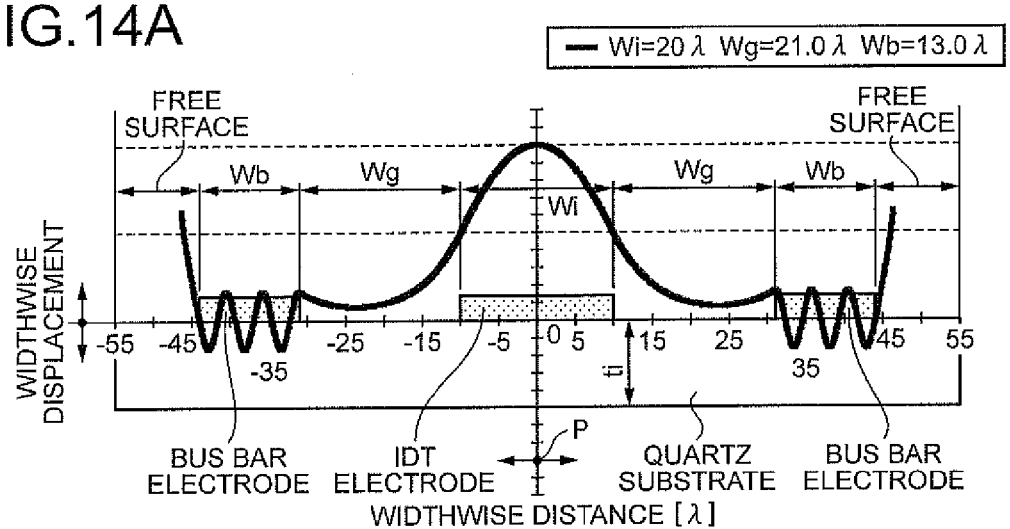
FIGS. 14A and 14B are explanatory diagrams showing a calculation result according to Example 10.
Figure 14B:
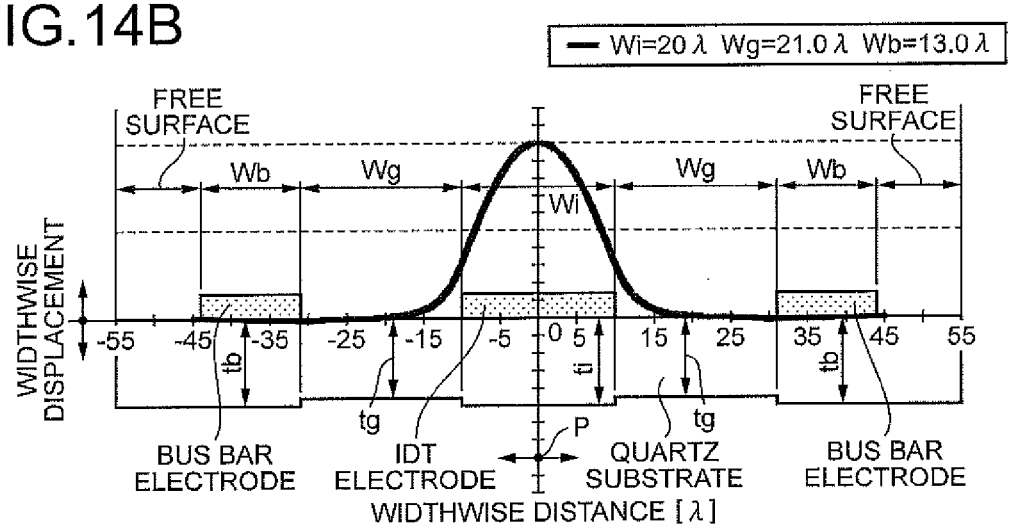

FIGS. 14A and 14B are explanatory diagrams showing a calculation result according to Example 10. In the Example 10, there is shown the case of arranging the Euler angles (0°, 42.0°, 5.0°), Wi=20λ, Wg=21.0λ, and Wb=13.0λ as an example, and FIG. 14A shows the widthwise displacement distribution of the quartz substrate in the resonant state in the case of arranging the quartz substrate to have an even thickness of ti=1.6λ.

As shown in FIG. 14A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 14B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.58λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

Example 11

Figure 15A:
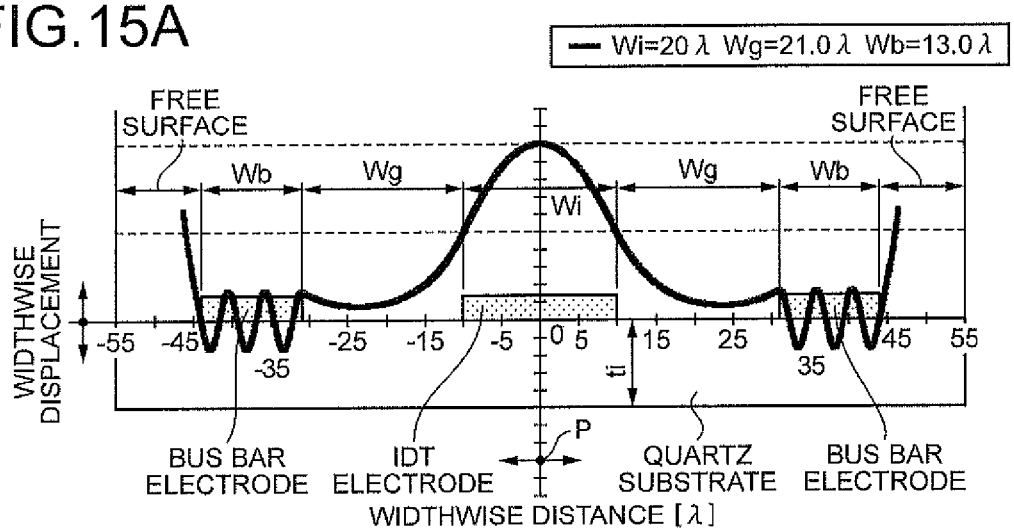
FIGS. 15A and 15B are explanatory diagrams showing a calculation result according to Example 11.
Figure 15B:
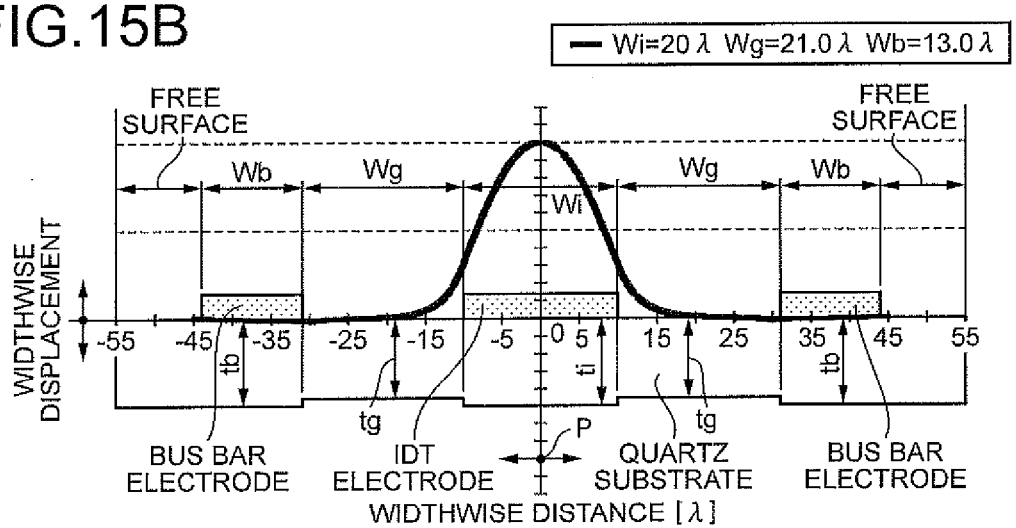

FIGS. 15A and 15B are explanatory diagrams showing a calculation result according to Example 11. In the Example 11, there is shown the case of arranging the Euler angles (0°, 42.0°, −5.0°), Wi=20λ, Wg=21.0λ, and Wb=13.0λ as an example, and FIG. 15A shows the widthwise displacement distribution of the quartz substrate in the resonant state in the case of arranging the quartz substrate to have an even thickness of ti=1.6λ.

As shown in FIG. 15A, in the case of arranging the thickness of the quartz substrate to be even, the widthwise displacement does not converge in the area outside the apposition width Wi and reaching the free surface, and the displacement in the outer ends of the quartz substrate in the widthwise direction becomes larger. In other words, it shows that the energy is not trapped because of the occurrence of the vibration leakage.

FIG. 15B shows the case of arranging the thickness tg in the gap area (Wg) of the quartz substrate to be smaller than the thickness ti thereof in the range of the apposition width Wi of the electrode finger elements of the IDT electrode, wherein the thicknesses of the respective areas are arranged to satisfy ti=tb=1.6λ, and tg=1.58λ.

According to this arrangement, in the areas outside the apposition width Wi and reaching the free surface, the widthwise displacement converges, and the displacement in the outer ends of the quartz substrate in the widthwise direction does not occur. In other words, it shows that the energy is trapped because the vibration leakage is prevented.

It should be noted that it is inferable that the energy can be trapped in the same manner as in the cases of the Example 1 through the Example 5 described above even in the case of arranging the thickness tg in the gap area (Wg) and the thickness tb in the bus bar electrode area of the quartz substrate to be equal to each other.

As explained hereinabove, in the Examples 1 through 5, it shows that in the case of the Euler angles (0°, 42.0°, 0°) of the quartz substrate, if the thickness ti of the quartz substrate in the apposition area of the electrode finger elements and the thickness tg of the quartz substrate in the areas between the respective outer ends of the apposition area and the bus bar electrodes satisfy the relationship of tg<ti, and $1.0\lambda \leq tg < 1.60\lambda$ in the range of the apposition width Wi of the IDT electrode satisfying $20.0\lambda \leq Wi \leq 40.0\lambda$ and the range of the gap Wg satisfying $2.0\lambda \leq Wg \leq 21.0\lambda$, it is in the state in which the displacement in the widthwise direction toward the free surface is prevented to thereby hardly cause the vibration leakage, namely in the state in which the energy is trapped.

Further, in the Examples 6 through 11, it shows that if the respective angles $\phi$, $\theta$, and $\psi$ of the Euler angles ($\phi$, $\theta$, $\psi$) of the quartz substrate satisfy $-1° \leq \phi \leq +1°$, $33.5° \leq \theta \leq 48.2°$, and $-5° \leq \psi \leq +5°$, and further the conditions of tg<ti, and $1.0\lambda \leq tg < 1.60\lambda$ are satisfied, the displacement in the widthwise direction toward the free surface of the quartz substrate can be prevented.

Further, by preventing the vibration leakage in the widthwise direction (the Y direction), it becomes possible to significantly reduce the amplitude of the reflected wave generated in the outer ends of the quartz substrate in the widthwise direction, thereby reducing the spurious caused by the reflected waves from the outer ends of the quartz substrate in the widthwise direction.

Thus, the drop of the Q-value as an important factor in evaluating the resonance characteristic of the Lamb-wave resonator and the increase in the CI value are prevented. Therefore, the oscillation of the Lamb-wave resonator can stably be maintained with the high Q-value, and the reduction of the power consumption can be realized with the low CI value.

It should be noted that the width Wb and the thickness tb of the bus bar electrode are not particularly limited providing the thickness ti of the quartz substrate in the apposition area of the electrode finger elements, the thickness tg of the quartz substrate in the areas between the respective outer ends of the apposition area and the bus bar electrodes, and the Euler angles ($\phi$, $\theta$, $\psi$) are arranged to be in the ranges of the conditions described above.

Subsequently, a result obtained by the simulation of the relationships of a frequency temperature deviation (frequency temperature variation), the phase velocity, and the electromechanical coupling coefficient $K^2$ with respect to each of the phase velocity, the normalized substrate thickness t/λ, and the angle $\theta$ in the Euler angles (0°, $\theta$, 0°) in the Lamb-wave resonator 1 (see FIGS. 2A, 2B, and 3) will be explained with reference to the drawings.

Figure 16:
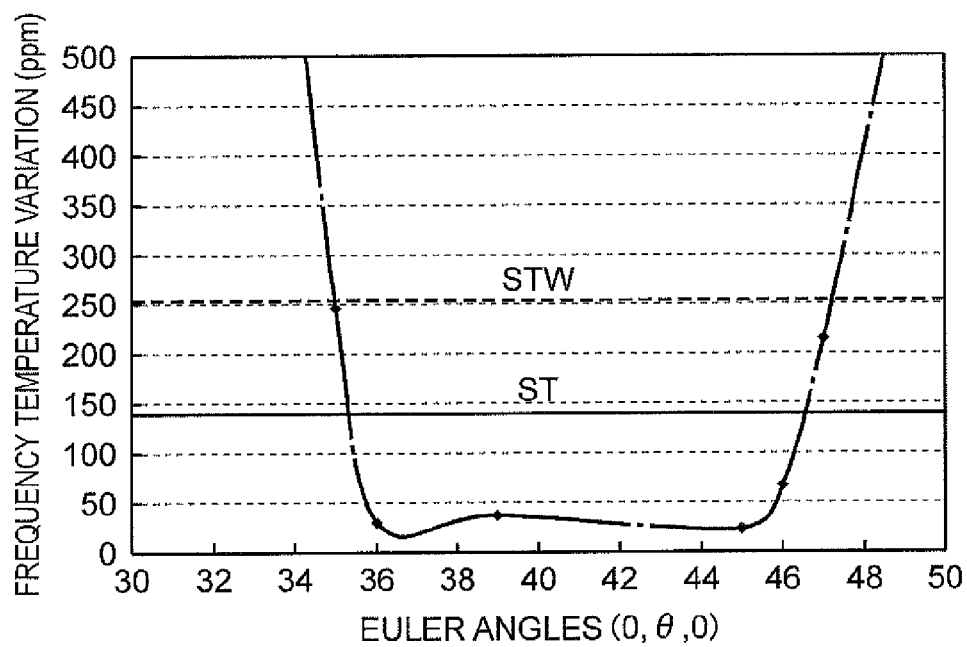
FIG. 16 is a graph showing a relationship between a frequency temperature variation and an angle $\theta$ of Euler angles (0°, $\theta$, 0°).

FIG. 16 is a graph showing a relationship between the frequency temperature variation (ppm) and the angle $\theta$ in the Euler angles (0°, $\theta$, 0°). FIG. 16 shows that the Lamb-wave resonator 1 has a frequency temperature characteristic more preferable than that of an STW-cut quartz device in the range of the angle $\theta$ satisfying $35° \leq \theta \leq 47.2°$.

It should be noted that the angle $\theta$ of the quartz substrate 10 more preferably satisfies $36° \leq \theta \leq 45°$. In the region of the angle $\theta$, the frequency temperature variation becomes substantially flat, and the frequency temperature characteristic thereof becomes superior to that of an ST-cut quarts device.

Figure 17:
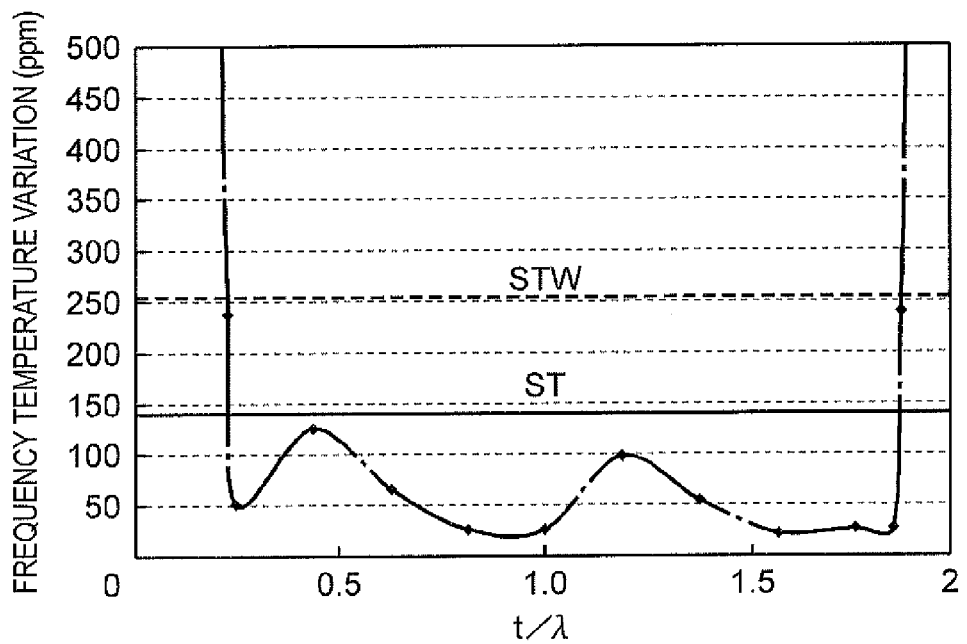
FIG. 17 is a graph showing a relationship between the frequency temperature variation and the normalized substrate thickness $t/\lambda$.

FIG. 17 is a graph showing the relationship between the frequency temperature variation (ppm) and the normalized substrate thickness t/λ. As shown in FIG. 17, the frequency temperature characteristic superior to those of the STW-cut quartz device and the ST-cut quartz device is obtained in the range of the normalized substrate thickness t/λ satisfying 0.176≦t/λ≦1.925. It should be noted that the normalized substrate thickness t/λ corresponds to ti/λ in each of the working examples described above.

Then, the mutual relationships between the angle θ and the normalized substrate thickness t/λ and the phase velocity, frequency temperature variation, and the electromechanical coupling coefficient $K^2$ will be explained in detail.

Figure 18:
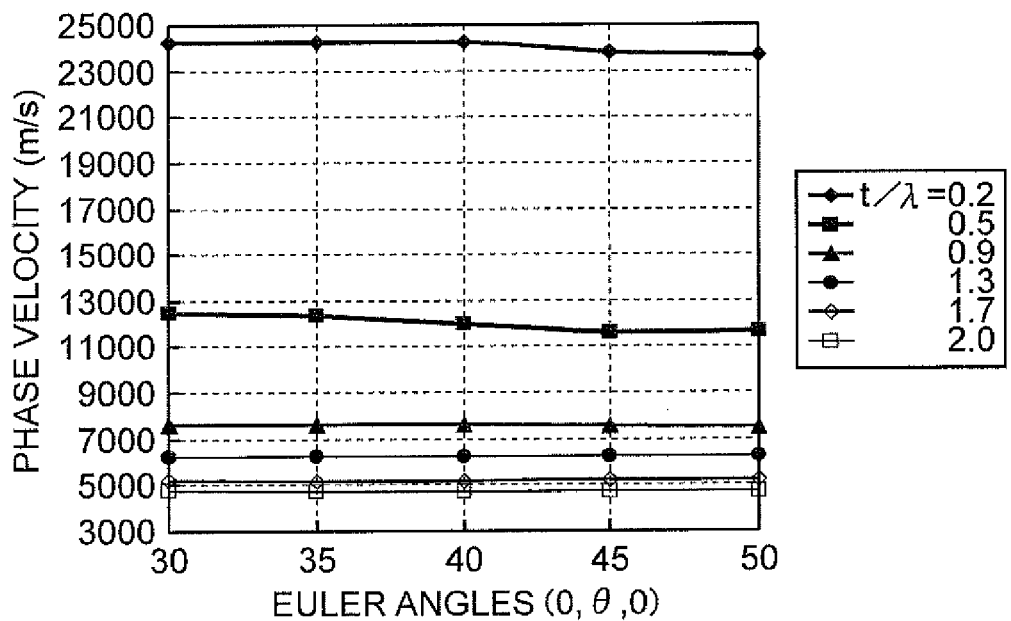
FIG. 18 is a graph showing a relationship between the angle $\theta$ and the phase velocity.

FIG. 18 is a graph showing a relationship between the angle θ in the Euler angles (0°, θ, 0°) and the phase velocity. Here, the normalized substrate thickness t/λ is set at 6 levels from 0.2 to 2.0, and the phase velocity corresponding to each of the levels of t/λ is plotted.

As shown in FIG. 18, in all cases except the case of the normalized substrate thickness t/λ=2.0, the phase velocity equal to or higher than 5000 m/s can be obtained with the angle θ existing in the range of 30° through 50°.

Figure 19:
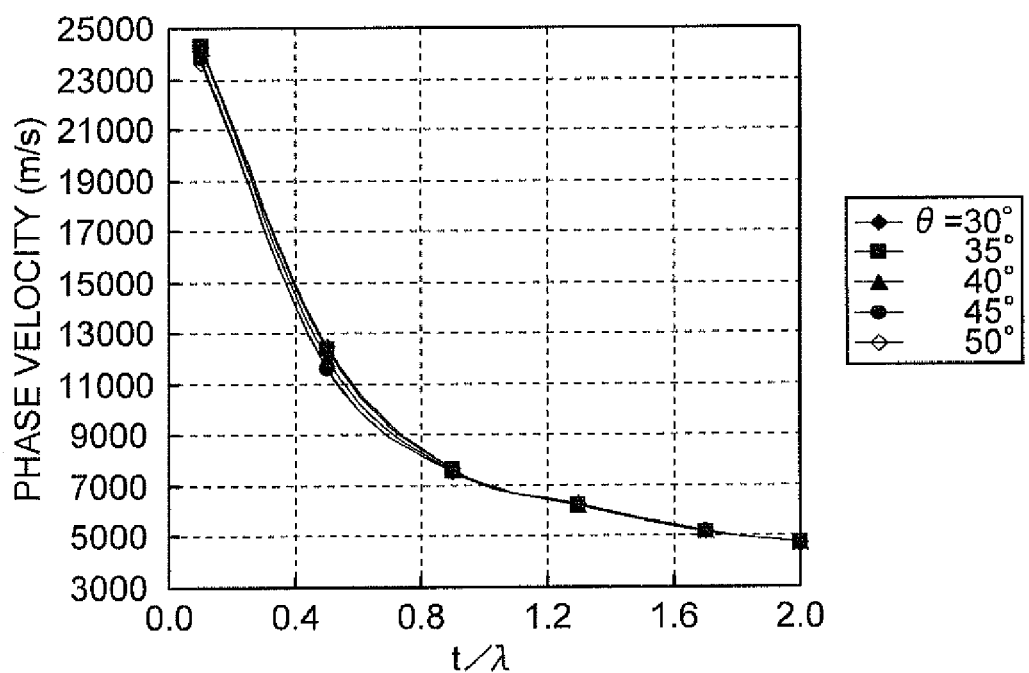
FIG. 19 is a graph showing a relationship between the normalized substrate thickness $t/\lambda$ and the phase velocity.

FIG. 19 is a graph showing the relationship between the normalized substrate thickness t/λ and the phase velocity. The angle θ in the Euler angles (0°, θ, 0°) is set at 5 levels from 30° to 50°, and the phase velocity corresponding to each of the levels of the angle θ is plotted.

As shown in FIG. 19, the variation in the phase velocity is small between the values of the angle θ, and the phase velocity equal to or higher than 5000 m/s can be obtained in most of the range of the normalized substrate thickness t/λ from 0.2 to 2.

Then, the mutual relationships between the angle θ in the Euler angles (0°, θ, 0°) and the normalized substrate thickness t/λ, and the phase velocity, the frequency temperature variation, and the electromechanical coupling coefficient $K^2$ will be explained.

Figure 20:
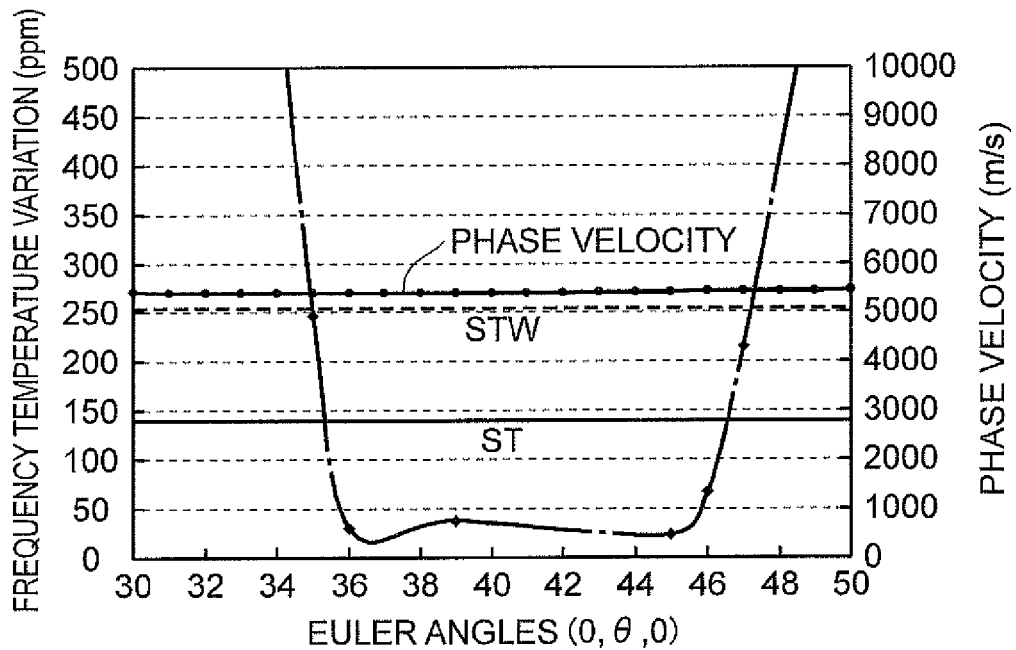
FIG. 20 is a graph showing relationships between the angle $\theta$, and the phase velocity and the frequency temperature variation.

FIG. 20 is a graph showing the relationships between the angle θ, and the phase velocity and the frequency temperature variation. It should be noted that the normalized substrate thickness t/λ is assumed to be 1.7.

As shown in FIG. 20, it shows that the range of the angle θ in which the frequency temperature variation thereof is smaller than that of the STW-cut quartz device is 35°≦θ≦47.2° (see also FIG. 17), and that the phase velocity equal to or higher than 5000 m/s can be obtained in this range.

Figure 21:
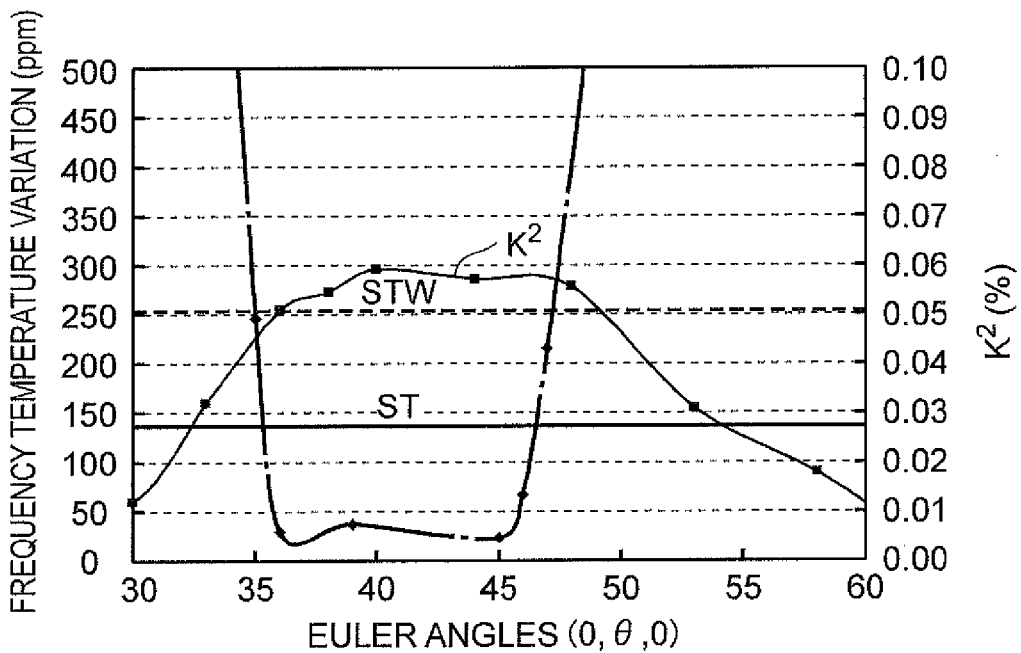
FIG. 21 is a graph showing relationships between the angle $\theta$, and an electromechanical coupling coefficient $K^2$ and the frequency temperature variation.

FIG. 21 is a graph showing relationships between the angle θ, and the electromechanical coupling coefficient $K^2$ and the frequency temperature variation. As shown in FIG. 21, the range of the angle θ in which the frequency temperature variation thereof is smaller than that of the STW-cut quartz device is 35°≦θ≦47.2° (see also FIG. 17).

In this range, the electromechanical coupling coefficient $K^2$ far exceeds 0.02, the value used as a reference. In the case of the range of the angle θ satisfying 32.5°≦θ≦47.2°, the electromechanical coupling coefficient $K^2$ becomes equal to or greater than 0.03, in the case of the range of the angle θ satisfying 34.2°≦θ≦47.2°, the electromechanical coupling coefficient $K^2$ becomes equal to or greater than 0.04, and in the case of the range of the angle θ satisfying 36°≦θ≦47.2°, the electromechanical coupling coefficient $K^2$ becomes equal to or greater than 0.05.

Figure 22:
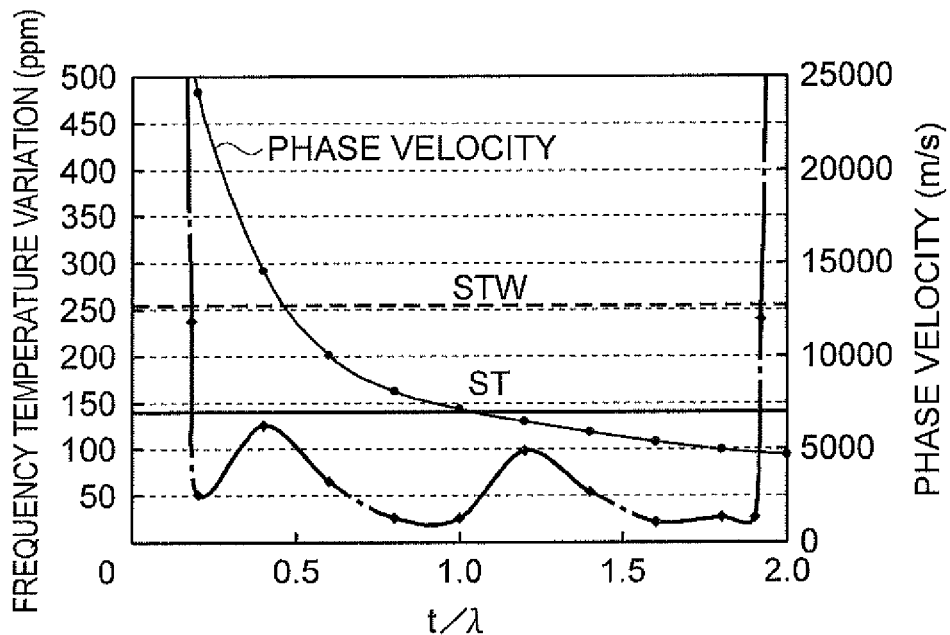
FIG. 22 is a graph showing relationships between the normalized substrate thickness $t/\lambda$, and the phase velocity and the frequency temperature variation.

FIG. 22 is a graph showing the relationship between the normalized substrate thickness t/λ, and the phase velocity and the frequency temperature variation. As shown in FIG. 22, the range of the normalized substrate thickness t/λ, in which the frequency temperature variation thereof is smaller than that of the STW-cut quartz device, is 0.176≦t/λ≦1.925, and the phase velocity equal to or higher than 5000 m/s can be obtained in most of this range. In this range of the normalized substrate thickness t/λ, the smaller the normalized substrate thickness t/λ is, the faster the phase velocity becomes, and therefore, the high frequency band becomes available. In other words, by adjusting the normalized substrate thickness t/λ, the phase velocity can be adjusted.

Figure 23:
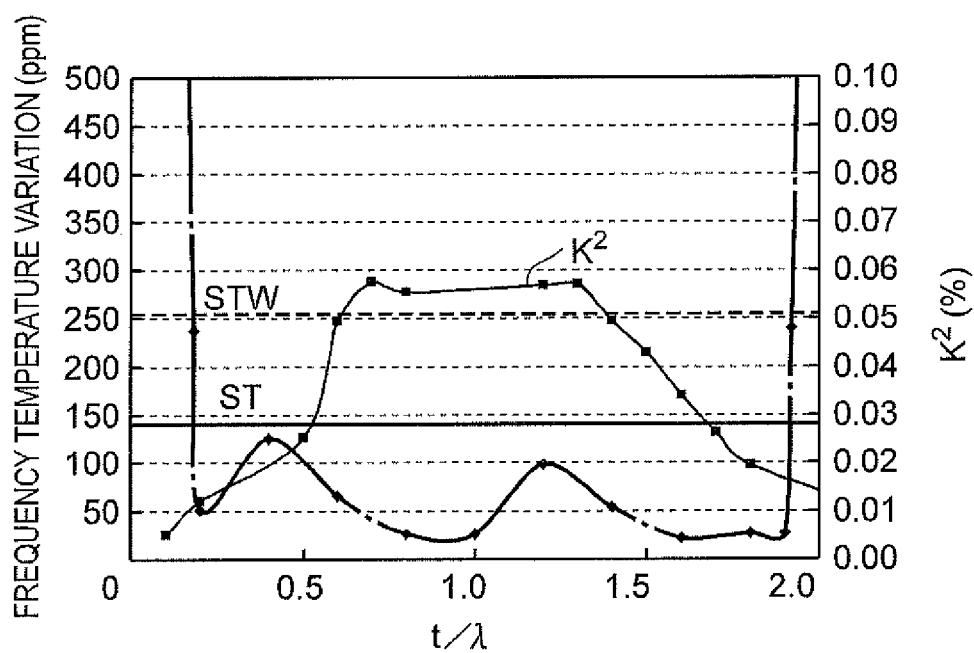
FIG. 23 is a graph showing relationships between the normalized substrate thickness t/λ, and the electromechanical coupling coefficient K² and the frequency temperature variation.

FIG. 23 is a graph showing relationships between the normalized substrate thickness t/λ, and the electromechanical coupling coefficient $K^2$ and the frequency temperature variation. As shown in FIG. 23, the range of the normalized substrate thickness t/λ, in which the frequency temperature variation thereof is smaller than that of the STW-cut quartz device, is 0.176≦t/λ≦1.925, and the electromechanical coupling coefficient $K^2$ equal to or greater than 0.02 can be obtained in most of this range. In the range in which the normalized substrate thickness t/λ is close to 1, the area with the electromechanical coupling coefficient $K^2$ as high as equal to or greater than 0.05 can be obtained.

It should be noted that although in the present embodiment the explanations are presented while showing the case of using the quartz substrate as the piezoelectric substrate as an example, it is possible to use piezoelectric materials other than the quartz crystal as the substrate. For example, lithium tantalate, lithium niobate, lithium tetraborate, langasite, and potassium niobate can be employed. Further, a piezoelectric thin film made of zinc oxide, aluminum nitride, tantalum pentoxide or the like, a piezoelectric semiconductor made of cadmium sulfide, zinc sulfide, gallium arsenide, indium antimony or the like is also applicable.

However, a quartz substrate and other piezoelectric substrates have a significant difference in resonance characteristics, particularly in temperature characteristics. Therefore, if a quartz substrate is employed as a piezoelectric substrate, the frequency variation with respect to the temperature is suppressed to be smaller, and thus, preferable frequency temperature characteristics can be obtained. As described above, by using a quartz substrate as the piezoelectric substrate, and employing the optimum electrode design conditions described above, it becomes possible to provide a Lamb-wave resonator superior in the frequency temperature characteristics, and having a high Q-value, and a low Cl value.

Further, although in the present embodiment the Al electrodes are used as the IDT electrode 20 and the reflectors 25, 26, it is also possible to use an alloy consisting primarily of Al for these electrodes. If an Al alloy containing Au, Ag, Cu, Si, Ti, Pb, or the like equal to or smaller than 10% in terms of ratio by weight is used, a substantially the same advantage can be obtained.

Oscillator

Subsequently, an oscillator will be explained.

The oscillator is configured including the Lamb-wave resonator described above, and an oscillation circuit (not shown) for exciting the Lamb-wave resonator. As the Lamb-wave resonator, one in the range of the electrode design conditions and the thickness design conditions of the quartz substrate described in the Examples 1 through 11 is employed.

Here, in each of the working examples in the range of the optimum electrode design conditions, the apposition width Wi of the electrode finger elements interdigitated to each other is in a range of 20λ through 40λ. The Lamb-wave resonator in the optimum electrode design conditions as described above can realize a high Q-value, and a low CI value. However, in the case in which the Lamb-wave resonator is attempted to be employed to an oscillator, the Lamb-wave resonator cannot be employed to the oscillator unless the oscillation conditions of the case of combining the Lamb-wave resonator with an oscillation circuit are satisfied.

In order to oscillate the Lamb-wave resonator, inductivity needs to be provided in the vicinity of a resonant frequency defined by the Lamb-wave resonator. For obtaining the inductivity in the vicinity of the resonant frequency, the apposition width Wi of the electrode finger elements interdigitated to each other is influential.

Figure 24:
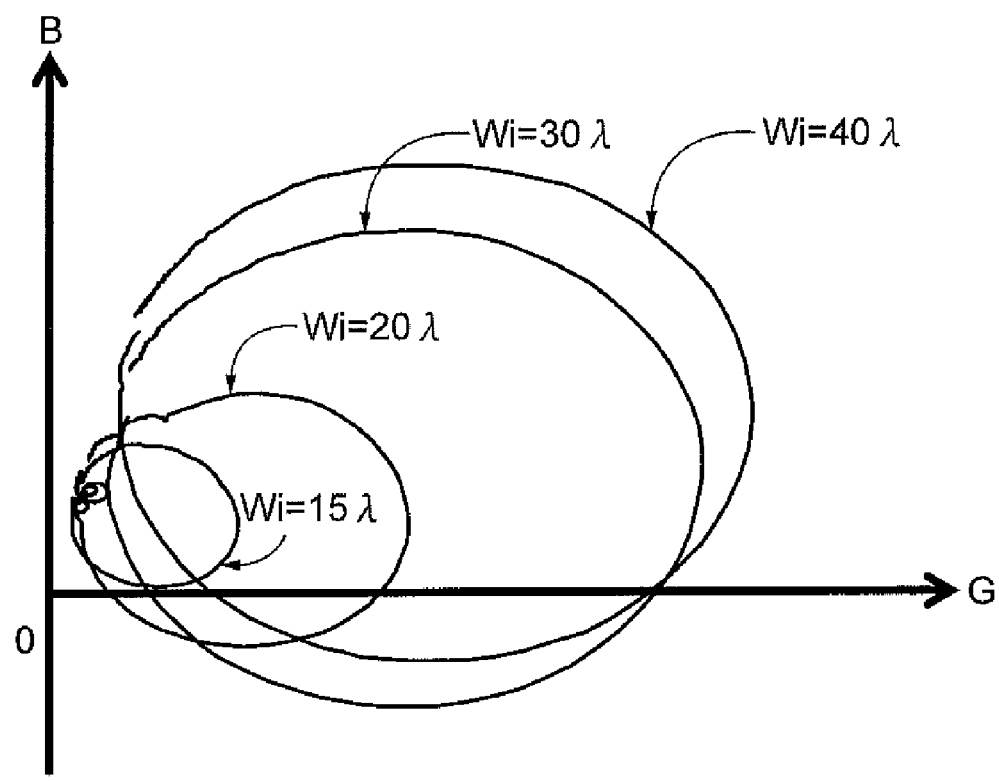
FIG. 24 is an admittance circle diagram in the vicinity of a resonant frequency.

FIG. 24 shows a measurement result of an admittance circle diagram in the vicinity of the resonant frequency. In FIG. 24, when Wi is equal to or smaller than 15λ, the admittance B becomes to satisfy B>0 showing capacitive property, and therefore, oscillation does not occur.

Further, if Wi is equal to or larger than 20λ, the admittance B becomes to satisfy B<0 showing inductivity, and therefore, the oscillation becomes possible when the Lamb-wave resonator and the oscillation circuit are assembled with each other.

Therefore, by employing the Lamb-wave resonator having the electrode finger elements interdigitated to each other with the apposition width Wi equal to or larger than 20λ, an oscillator having preferable oscillation characteristics can be realized.

Modified Examples

It should be noted that although the explanations are presented while showing the structure with the quartz substrate using a plate structure in the working examples described above, a reverse mesa structure cam also be adopted.

Figure 25A:
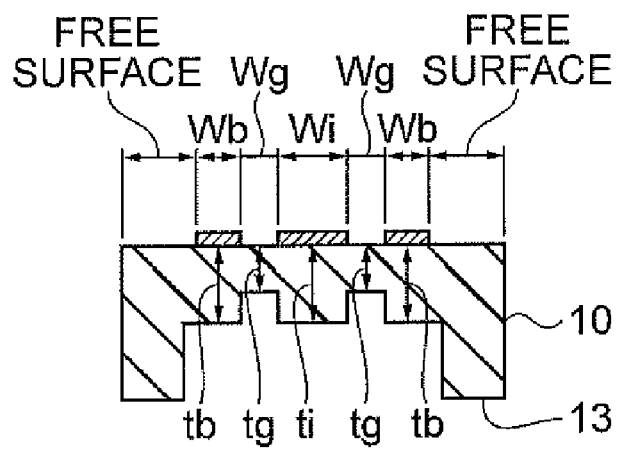
FIGS. 25A through 25C are cross-sectional diagrams showing modified examples.
Figure 25B:
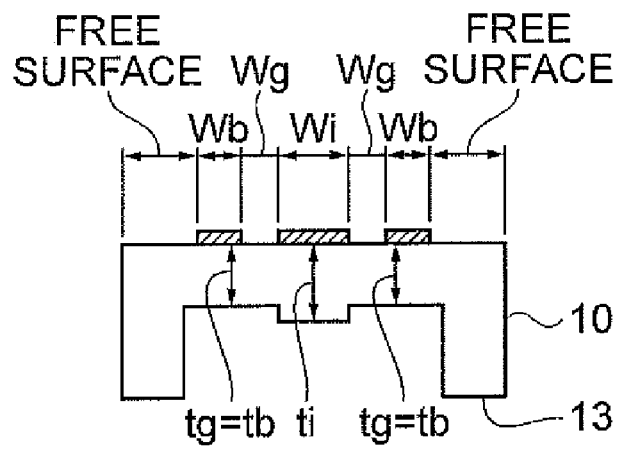
Figure 25C:
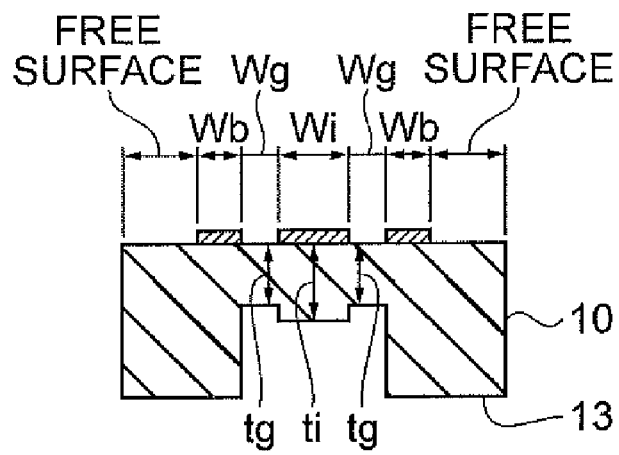

FIGS. 25A through 25C are cross-sectional diagrams showing modified examples. FIGS. 25A and 25B show, as examples, the case in which the thickness of the quartz substrate 10 in the portion outside the IDT electrode 20 and the reflectors 25, 26, namely the peripheral portion 13 of the quartz substrate 10, is larger than the thickness ti of the quartz substrate in the area of the apposition width Wi of the electrode finger elements.

According to the configuration described above, the strength of the quartz substrate 10 itself increases, thereby making it possible to prevent a damage of the quartz substrate 10.

FIG. 25C shows the case, as an example, in which the thickness of the quartz substrate in the area straddling the formation area of the bus bar electrodes 21d, 22c and the free surfaces is larger than the thickness ti of the quartz substrate in the area of the apposition width Wi.

According to this configuration, there is provided an advantage of increasing the strength of the quartz substrate 10 itself, and at the same time, improving the impact resistance when performing wire bonding for establishing connection with the oscillation circuit.

It should be noted that the Lamb-wave resonator described hereinabove can be applied to filters, sensors, and so on besides the oscillator.

The entire disclosure of Japanese Patent Application No. 2009-067544, filed Mar. 19, 2009 is expressly incorporated by reference herein.

What is claimed is:

1. A Lamb-wave resonator comprising:
a piezoelectric substrate;
an IDT electrode disposed on one principal surface of the piezoelectric substrate, having bus bar electrodes each connecting one ends of a plurality of electrode finger elements, the other ends of the plurality of electrode finger elements being interdigitated with each other to form an apposition area; and
a pair of reflectors disposed on the one principal surface of the piezoelectric substrate, and respectively arranged on both sides of the IDT electrode in a propagation direction of a Lamb wave,
wherein denoting a thickness of the piezoelectric substrate in the apposition area of the electrode finger elements as ti, a thickness of the piezoelectric substrate in areas between respective ends of the apposition area in a direction perpendicular to the propagation direction of the Lamb wave and the bus bar electrodes as tg, and a wavelength of the Lamb wave as λ, the thickness ti exists in a range represented by $0 < ti/\lambda \leq 3$, and a relationship of $tg < ti$ is satisfied.

2. The Lamb-wave resonator according to claim 1, wherein the piezoelectric substrate is a quartz substrate having Euler angles ($\phi$, $\theta$, $\psi$) in ranges of $-1° \leq \phi \leq +1°$, $35.0° \leq \theta \leq 47.2°$, and $-5° \leq \psi \leq +5°$, and a relationship between the thickness tg and the wavelength λ of the Lamb wave satisfying $1.0\lambda \leq tg < 1.60\lambda$.

3. The Lamb-wave resonator according to claim 1, wherein a width of the apposition area of the electrode finger elements is one of equal to and larger than 20λ.

4. An oscillator, comprising:
the Lamb-wave resonator according to claim 1; and
an oscillation circuit adapted to excite the Lamb-wave resonator.

* * * * *